United States Patent
Grundy et al.

(10) Patent No.: US 7,613,011 B2
(45) Date of Patent: Nov. 3, 2009

(54) SIGNAL-SEGREGATING CONNECTOR SYSTEM

(75) Inventors: Kevin P. Grundy, Fremont, CA (US); Gary Yasumura, Santa Clara, CA (US); Joseph C. Fjelstad, Maple Valley, WA (US); William F. Wiedemann, Campbell, CA (US); Para K. Segaram, Brookfield (AU)

(73) Assignee: Interconnect Portfolio LLC, Cupertino, CA (US)

( * ) Notice: Subject to any disclaimer, the term of this patent is extended or adjusted under 35 U.S.C. 154(b) by 0 days.

(21) Appl. No.: 11/748,045

(22) Filed: May 14, 2007
(Under 37 CFR 1.47)

(65) Prior Publication Data

US 2007/0236901 A1 Oct. 11, 2007

Related U.S. Application Data

(63) Continuation of application No. 11/097,450, filed on Apr. 1, 2005, now Pat. No. 7,227,759.

(60) Provisional application No. 60/559,098, filed on Apr. 1, 2004.

(51) Int. Cl.
*H05K 7/12* (2006.01)
(52) U.S. Cl. .................. 361/785; 361/736; 361/801; 439/631; 439/61; 439/62
(58) Field of Classification Search .............. 361/736, 361/760, 785, 801, 803; 439/61, 62, 76.1, 439/65, 631, 63
See application file for complete search history.

(56) References Cited

U.S. PATENT DOCUMENTS

| | | | | |
|---|---|---|---|---|
| 4,116,519 A | * | 9/1978 | Grabbe et al. | 439/69 |
| 4,241,381 A | * | 12/1980 | Cobaugh et al. | 361/785 |
| 4,322,120 A | | 3/1982 | Rilling | |
| 4,511,950 A | | 4/1985 | Bunner et al. | |
| 5,024,609 A | * | 6/1991 | Piorunneck | 439/637 |
| 5,083,238 A | | 1/1992 | Bousman | |
| 5,754,796 A | | 5/1998 | Wang et al. | |
| 5,904,581 A | * | 5/1999 | Pope et al. | 439/74 |
| 5,908,333 A | | 6/1999 | Perino et al. | |
| 6,004,139 A | | 12/1999 | Dramstad | |
| 6,097,883 A | * | 8/2000 | Dell et al. | 710/301 |
| 6,222,739 B1 | | 4/2001 | Bhakta et al. | |
| 6,253,266 B1 | | 6/2001 | Ohanian | |
| 6,382,986 B1 | * | 5/2002 | Kim et al. | 439/74 |
| 6,411,539 B2 | | 6/2002 | Funaba et al. | |
| 6,796,803 B2 | * | 9/2004 | Abe | 439/62 |
| 7,014,472 B2 | * | 3/2006 | Fjelstad et al. | 439/65 |
| 7,029,285 B2 | * | 4/2006 | Abe | 439/62 |
| 7,035,116 B2 | * | 4/2006 | Kuzmenka | 361/789 |
| 7,227,759 B2 | * | 6/2007 | Grundy et al. | 361/785 |
| 2002/0142660 A1 | | 10/2002 | Abe | |
| 2003/0053302 A1 | | 3/2003 | Kelly et al. | |

OTHER PUBLICATIONS

Foreign Search Report, PCT/US2005/012576.

* cited by examiner

*Primary Examiner*—Dameon E Levi
(74) *Attorney, Agent, or Firm*—Ronald R. Shea, Esq.

(57) ABSTRACT

A signal-segregating connector for use in a system having a printed circuit board, a first electrical structure and a second electrical structure. The connector includes a first set of conductive elements to convey signals between the first electrical structure and the printed circuit board, and a second set of conductive elements to convey signals between the first electrical structure and the second electrical structure.

15 Claims, 31 Drawing Sheets

SIGNAL-SEGREGATING CONNECTOR SYSTEM

CROSS-REFERENCE TO RELATED APPLICATIONS

This application claims priority from, and hereby incorporates by reference, U.S. Provisional Application No. 60/559,098, filed Apr. 1, 2004 and entitled: "Planar Connector." This application also claims priority from, and hereby incorporates by reference, U.S. patent application Ser. No. 11/097,450 filed Apr. 1, 2005, now U.S. Pat. No. 7,227,759 and entitled: "SIGNAL-SEGREGATING CONNECTOR SYSTEM."

TECHNICAL FIELD

The present invention relates to the field of electrical signal interconnection systems.

BACKGROUND

Today's computers, routers, switches and servers often rely upon in-line connectors designed for low manufacturing cost as well as easy attachment and removal of certain electrical components that are commonly upgraded after purchase. Personal computers and laptops, for instance, often incorporate memory connectors designed to allow consumers to upgrade system memory. Likewise, routers and switches often incorporate line card connectors, by which customers may upgrade system capacity and/or capability in the field.

Most electrical components in a computing system, including in-line connectors, are connected to the printed circuit board (PCB) using plated through hole structures commonly referred to as a "vias." Vias are known to be significant sources of signal distortion, reflection, attenuation and capacitance. These problems have a greater detrimental effect on high frequency signals than on low frequency signals and, accordingly, efforts have been made to incorporate via-free structures by which components may be attached to PCBs and across which high frequency electrical signals may be transferred between electrical components. Elimination of vias does not, however, represent a critical issue for the structures that connect low frequency signals, power or ground.

One form of commonly used in-line connector is illustrated in FIG. 1, which is a prior art DIMM (dual inline memory module) connection system. Pictured is a typical DIMM 109, which integrates a group of memory chips 110 onto a small printed circuit board (PCB) 111, which is inserted into the DIMM connector 112 (sometimes called a "DIMM socket"). The DIMM connector is typically attached to a larger primary system PCB (not shown), which is often referred to as the "mother board", which integrates the system's electrical power circuits, ground circuits, and various other electrical components. The method of electromechanical connection between an in-line connector and a mother board is generally the previously described pin-and-hole architecture. Pins typically extend down from the base of the DIMM connector and anchor in plated through holes located on the mother board. This system and other efforts in the art for connecting in-line components and distributing signals leave an opportunity for further improvement by introducing novel elements.

BRIEF DESCRIPTION OF THE DRAWINGS

The present invention is illustrated by way of example, and not by way of limitation, in the Figures of the accompanying drawings and in which like reference numerals refer to similar elements and in which.

DETAILED DESCRIPTION

Figure 1:
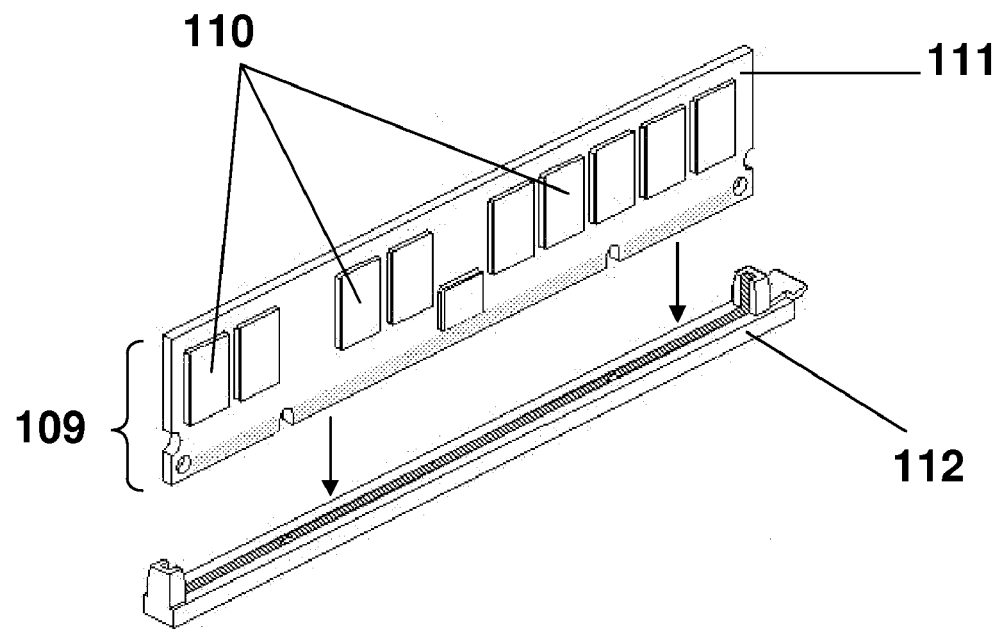
FIG. 1 illustrates a prior art connection system for DIMMs.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Signals and signal paths may be optical. Signal paths may be impedance controlled, such as provided by coax, twinax, etc.

In the following descriptions references are made to DIMMs (Dual Inline Memory Modules). While DIMMs are a specific implementation of a system module, references to DIMMs throughout this disclosure are also anticipated to include any other form of removable module. This includes but is not limited to DRAM, SRAM, CPU, optical, digital or analog modules.

In the following descriptions references are made to signals and signal paths. Signals, while typically referring to data, may also be power or ground.

In the following descriptions references are made to signals having differing levels of sensitivity to electronic disturbance or degradation by features intrinsic to themselves and their path or to other nearby signal paths, components or circuit features. More specifically, signals that are sensitive to electronic disturbance or degradation are sometimes referred to herein as "high frequency signals," or "high-speed signals." By contrast, signals that are generally insensitive to such disturbance or degradation are referred to herein as "low frequency signals" or "low-speed signals." Signals within an electronic circuit may thus be either integrity-sensitive or integrity-tolerant. For example certain data signals transmitted at high signal rates can be unacceptably degraded by design features that are normally encountered along the length of their signal path including; dielectric materials, conductor materials, minute manufacturing defects, changes in signal path direction, plated vias, changed in impedance, crosstalk, skew, electronic stubs and the like. In contrast, other signals within a design, which are less sensitive to these concerns, would include DC circuits including power and ground and lower order connections used to control less frequently accessed circuit elements.

In the following descriptions references are made to segments of connectors. References and drawings referring to positions of segments (for instance such as middle, center, and end) are used to convey general location. Alternate segment positions are allowed and anticipated. A complete connector may be constructed with separately manufactured segments which are assembled into a complete connector or a connector may be manufactured with differing segments as a monolithic unit.

In the following descriptions, references are made to modular connectors and components that allow for high speed signal paths, traveling between one instance of the modular connectors and another instance of the modular connection. Any reference showing more than one modular components connecting together includes embodiments where two or more such components are combined.

Figure 2A:
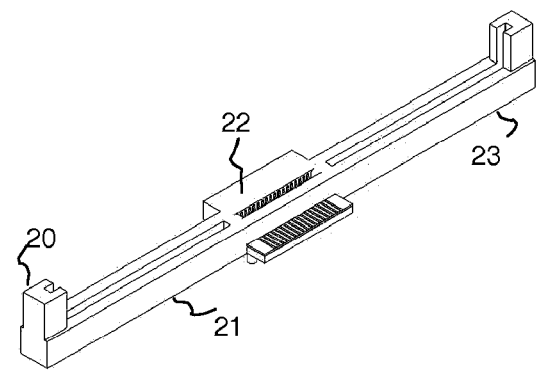
FIG. 2A illustrates an embodiment, showing a DIMM connector with a planar high frequency signal connection system.

FIG. 2A illustrated an embodiment in which a DIMM connector 20 comprises multiple segments 21, 22, 23. The low frequency signal segments 21, 23 carry low frequency signals and are configured similar to existing DIMM connectors. The high frequency signal segment 23 carries the high frequency signals.

Figure 2B:
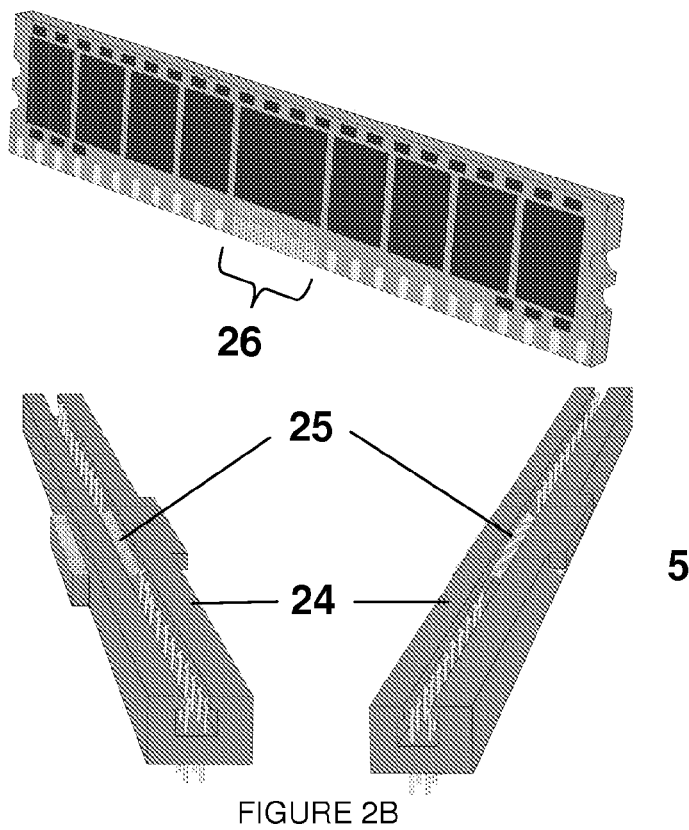
FIG. 2B illustrates 3 perspective views of an embodiment, showing a DIMM connector and a DIMM with planar high frequency connections.

FIG. 2B illustrates a right and left perspective view of an embodiment DIMM connector and a representative DIMM. Metal pins are extend downward from the DIMM connector 24 for connection to a PCB (not shown). The connector's high frequency segment 25 includes precision contacts which accept the DIMM's high frequency signal paths 26. The high frequency segment 25 provides for a finer signal pitch connection between the high frequency paths on the DIMM connector and the high frequency paths on DIMM. In this embodiment, addition, the high frequency segment 25 of the connector provides for signal routing in a general lateral direction to other connectors, not through the bottom of the connector.

Figure 2C:
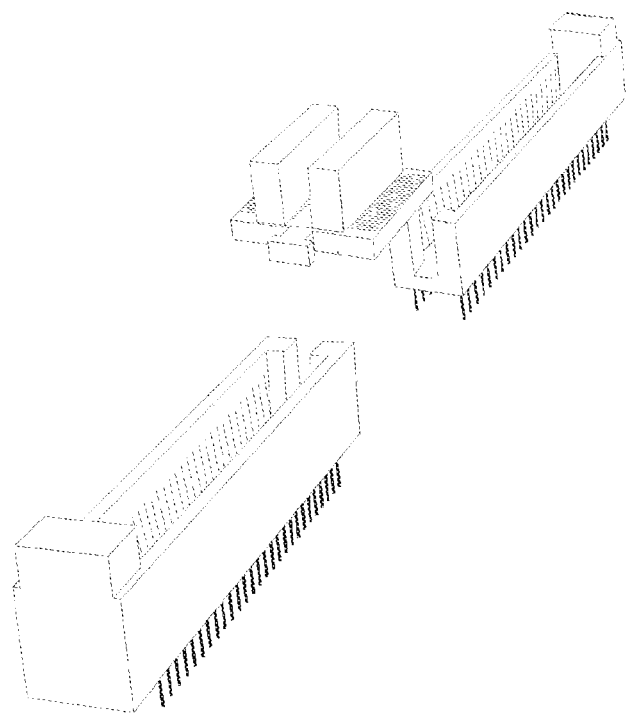
FIG. 2C illustrates a perspective view of an embodiment in which a DIMM connector has a planar high frequency signal connection system constructed as three individual interlocking segments.

FIG. 2C illustrates another embodiment wherein the separate segments 21, 22, 23 of the connector are manufactured as separate pieces with interlocks.

Figure 3A:
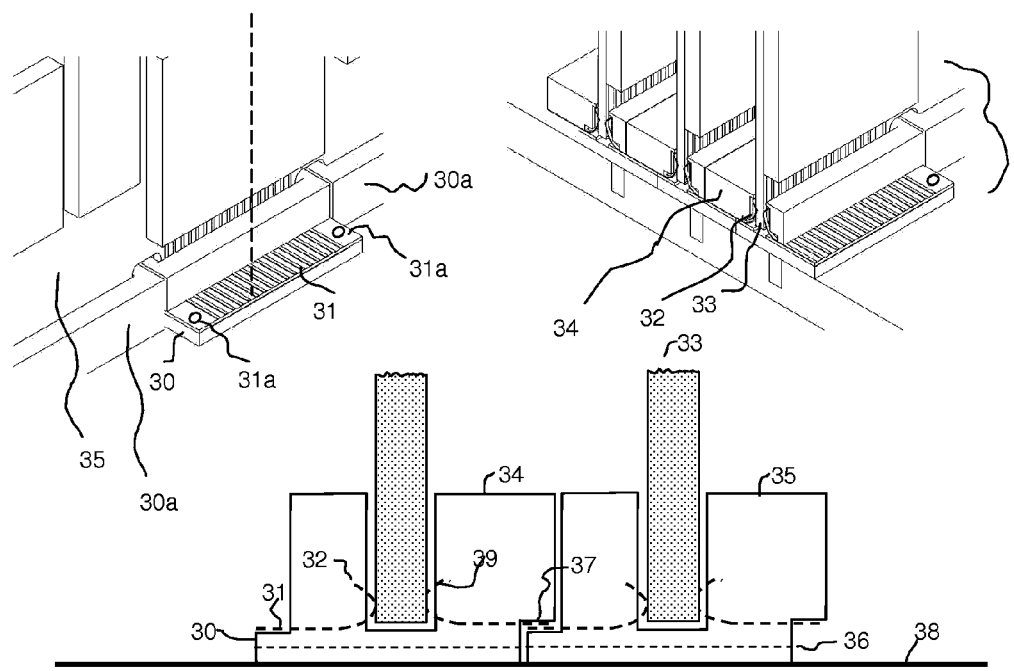
FIG. 3A illustrates detailed views of an embodiment in which a DIMM connector incorporates a planar high frequency connector to connection system.

FIG. 3A illustrates several views of an embodiment of the connector in FIG. 2B in which the high frequency segment of the connector 30 is a separate module from the low frequency segments 30a. The upper left illustration shows the high frequency segment 30 mated to the low frequency segments 30a with a DIMM connecting from above. The upper right illustration shows a cross section of three connectors mated from to back with three counterpart DIMMs connecting from above. The body 34 of the high frequency segment of the front connector houses conductors 32 which make contact with a DIMM inserted from above. The bottom illustration shows a side view of two connectors 34, 35 mated back to back. One end of each conductors has a step 31 that is exposed as a contact area on its top surface. The other end has a shelf 37 exposed as a contact area on its bottom surface so that two connectors 35, 35 mate as shown in the center of the illustration. Placing two connector bodies 34, 35 together creates a complete signal path between DIMMs. In this manner, signals are not required to travel down to the PCB and back up to the next connector. Instead they travel directly between each other, generally in a single plane. In addition, since the connectors connect to each other directly, it is possible to achieve finer signal conductor pitches and thereby facilitate higher signal density and lower cost solutions. Neither conductor 31, 39 need be monolithic or configured in the oval shape shown. Alignment between connectors 34 is desirable with fine pitch signal conductors. Alignment features 31a are provided on both the upper shelf 37 and the lower step 30. The alignment features may be, but are not limited to peg and hole or ridge and slot. Because the high frequency connector bodies 34 35 are aligned relative to themselves, and not to the underlying PCB 38, it is possible to build more finely pitched signal conductor structures and still maintain alignment between connectors. The conductors may be constructed from spring metal, wires, metalized plastic, plating, or any other conductive material. Methods for attaching the two conductors 32, 39 to each other include but are not limited to: solder, anisotropic adhesive, conductive adhesive, compression, gold dots, welding or springs. A conductive layer 30 below the opening for the DIMM is anticipated for the signal ground to be included so that the conductors above 32, 39 have a ground reference.

In FIGS. 2A through 3B, the high frequency segment of each connector does not have to be in the middle but may be placed anywhere along the length of the connector. There may be one or more high frequency segments in a connector or one or more low frequency segments.

Figure 4A:
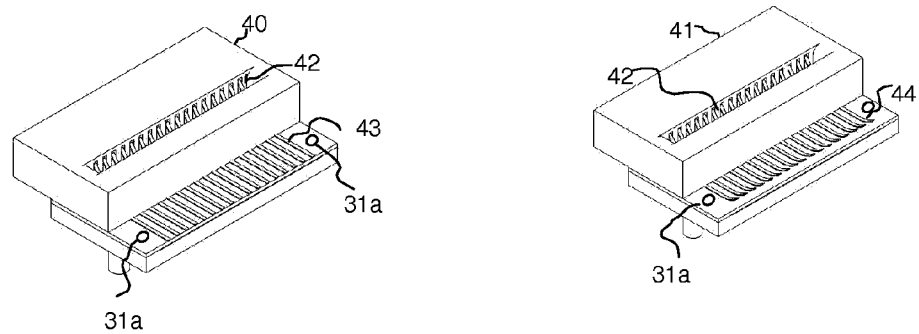
FIG. 4A illustrates two versions of the central portion of the DIMM connector with planar high frequency connection system.
Figure 4B:
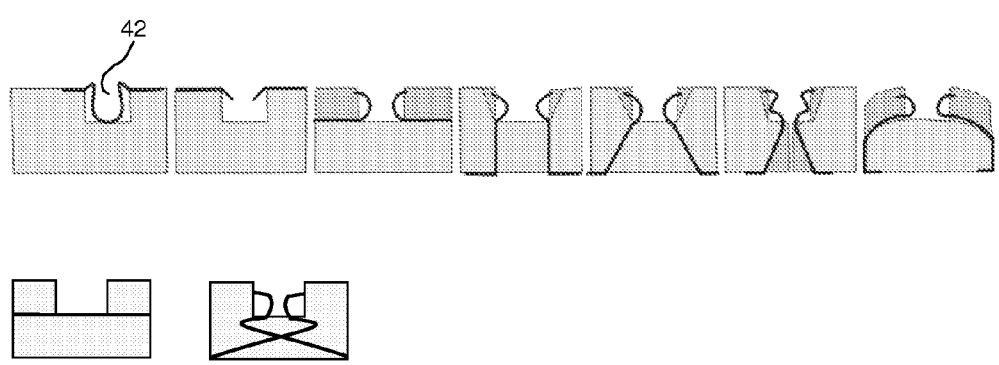
FIG. 4B shows various spring arrangements for making and maintaining contact alignment.

FIG. 4A illustrates two embodiments of conductors on the exposed surfaces where the connectors in FIG. 3A mate. In one embodiment, conductors are generally coplanar with the PCB 38 and do not have curved ends. In another embodiment, conductors are generally coplanar with the PCB 38 and curved 44 at their ends. FIG. 4B illustrates multiple embodiments of conductor structure for the high frequency segment 34, 35.

Figure 3B:
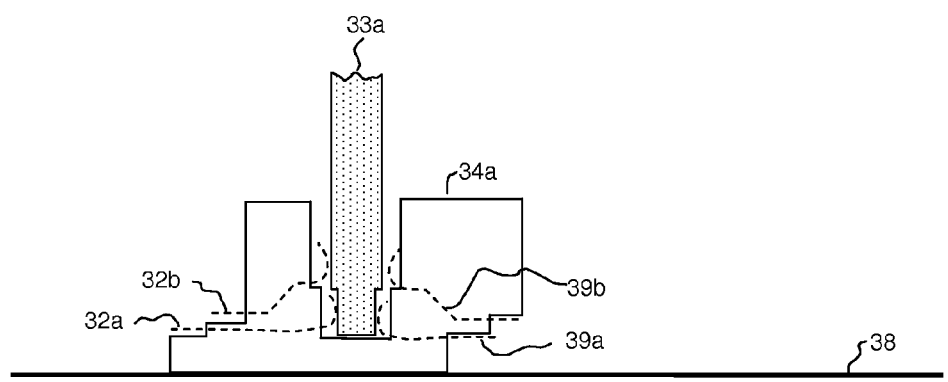
FIG. 3B illustrates detailed views of DIMM connector with planar high frequency connection system utilizing stair-steps.

FIG. 3B illustrates another embodiment which comprises stair steps on both the DIMM 33a and the connector 34a to increase signal density. Signal paths 32a, 39a comprise one set of steps for connection while signal paths 32b, 39b comprise different steps. Although illustrated as two steps, there is no limit to the number of steps anticipated.

Figure 5:
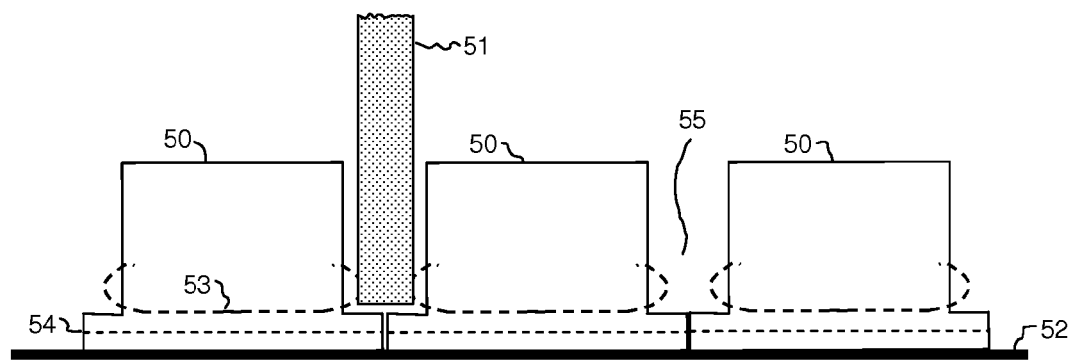
FIG. 5 illustrates a high frequency planar DIMM connector where a single DIMM module connector is formed by two separate connector bodies.

Another embodiment is illustrated in FIG. 5. Two connectors are formed by placing three similar connector bodies 50 together. The connector bodies 50 provide for a left and a right contact surface for the two card edges of separate DIMMs to be inserted from above. The connector bodies 50 are connected and aligned to each other through the use of an alignment and capture system such as the "nail-head" 243 and slot 350 arrangement illustrated in FIG. 35. This embodiment requires only the connections between the body of a first DIMM and the body of a second DIMM, whereas four exist in the embodiment shown in FIG. 3A. The conductor 53 may be created from metal, wire, frames, flex, etching or any other suitable electrically conductive technologies.

Figure 6:
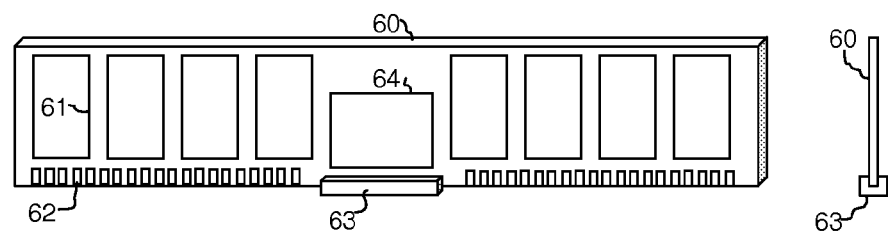
FIG. 6 illustrates a DIMM module with attached signal adaptor.
Figure 7:
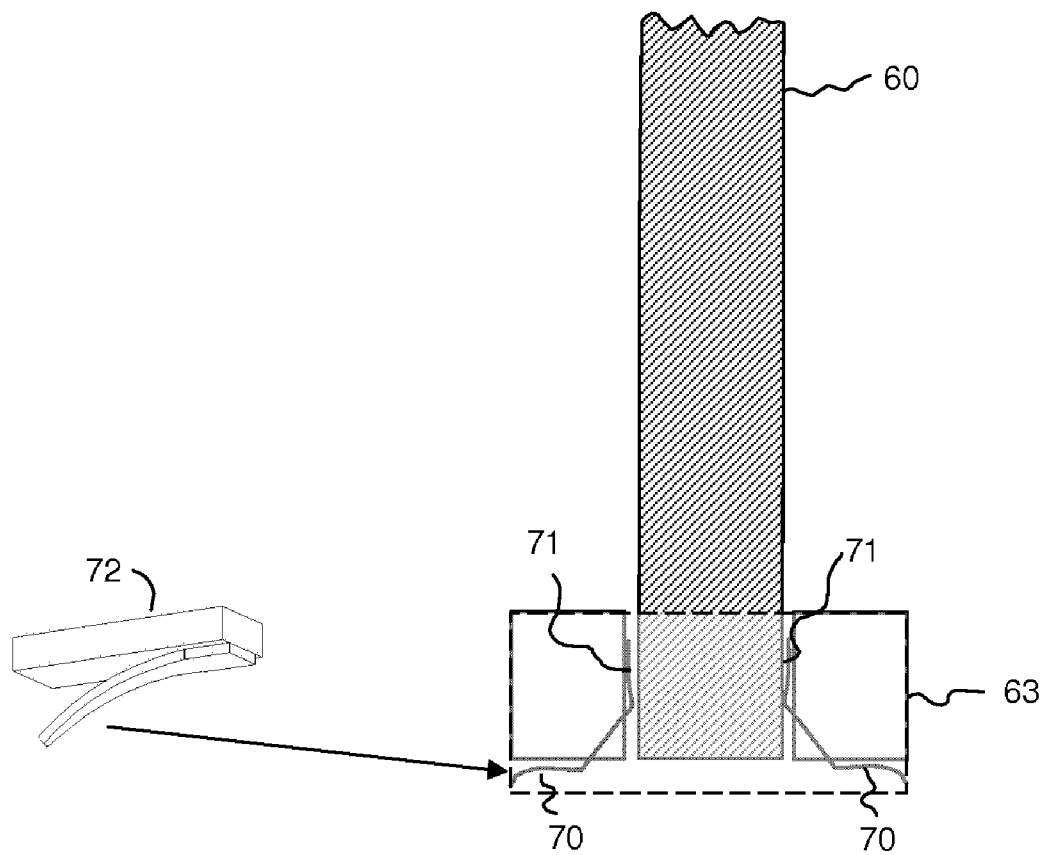
FIG. 7 illustrates a close-up view of the DIMM module with added signal adaptor.
Figure 8:
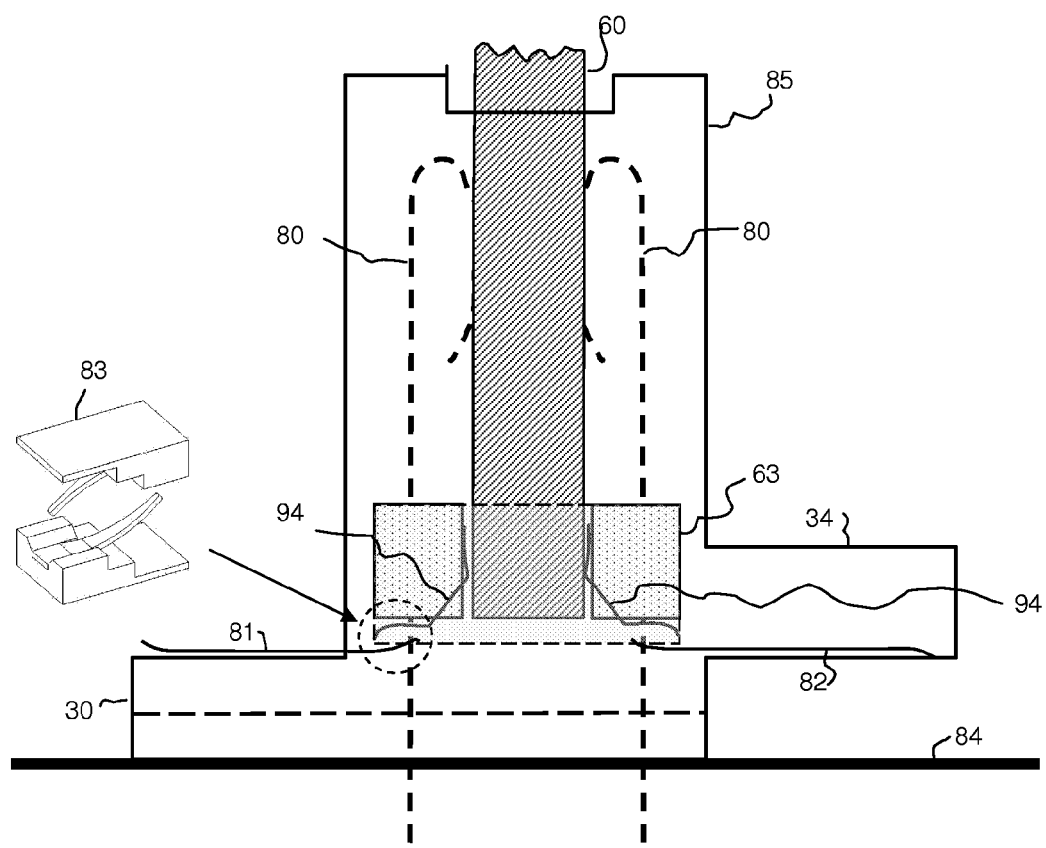
FIG. 8 illustrates a cross-section view of a DIMM module with attached signal adaptor inserted into a high frequency planar DIMM connector.

Another embodiment is illustrated in FIG. 6. In the high frequency section of the DIMM, a signal adaptor 63 is added. The signal adaptor 63 translates signal paths from vertical orientation to horizontal orientation. FIG. 7 provides a detailed illustration of the signal adaptor 63. Conductor 71 makes contact with the DIMM 60 card edge conductive pads, picking up DIMM signals. The conductors 71 in signal adaptor 63 exit the bottom of the signal adaptor at predominantly 90 degrees from the DIMM card 60. The conductor 71 may be created from metal, wire, frames, flex, etching or any other suitable electrically conductive technologies. The conductor shape 72 may be flat or curved. As part of the embodiment, a corresponding connector capable of receiving a combined DIMM 60 with signal adaptor 63 is illustrated in FIG. 8 in a side view. Signal conductors 80 from a legacy DIMM connector are shown for reference and are not part of the high frequency connector 85 segment.

Figure 9:
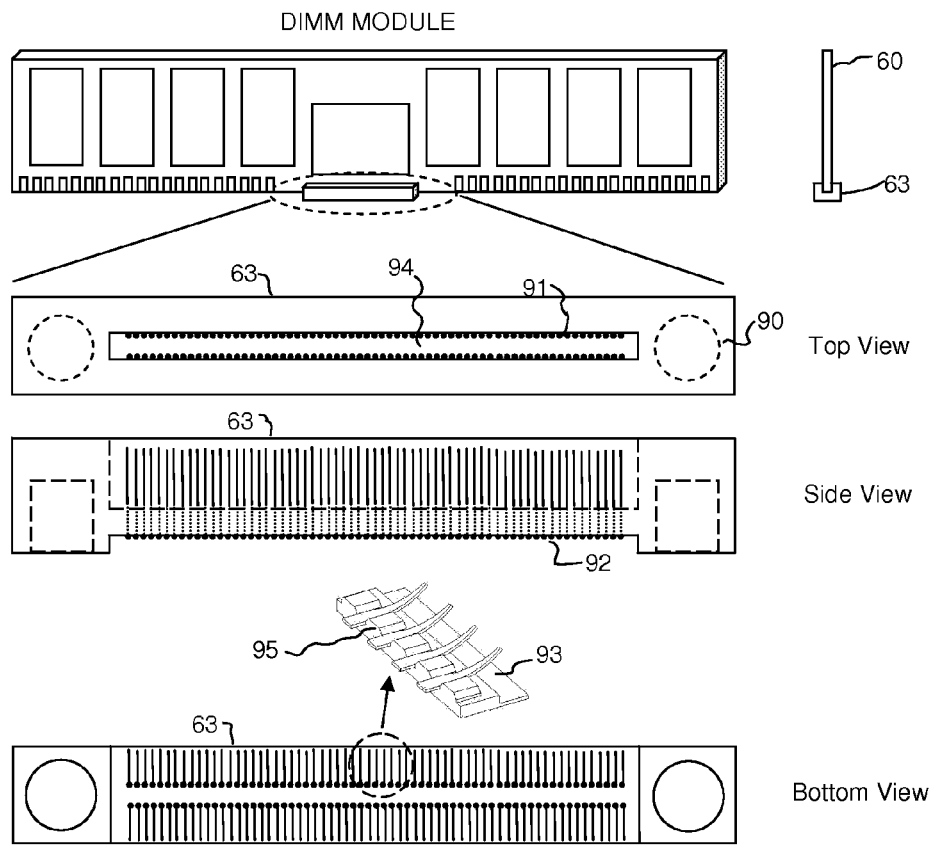
FIG. 9 illustrates multiple detailed views of a DIMM module signal adaptor.

FIG. 9 illustrates multiple detailed views of an embodiment of a DIMM module signal adaptor. Conductors 94 provide for a method by which a DIMM edge card signal pad may be connected to the DIMM. One method of attachment is through a compressive fit by making the slot opening 94 of the signal adaptor slightly smaller than the depth of the DIMM card. During manufacture of the DIMM, accurate placement may be achieved more economically. Once the signal adaptor is placed on the DIMM 60, accurate alignment of the DIMM into a high frequency connector 85 (FIG. 8) may be achieved during DIMM insertion through the use of alignment features 90. FIG. 9, in the bottom view, also illustrates an embodiment of the contacts 92 for the bottom of the signal adaptor 63. In this embodiment, the contacts 92 are curved and are separated by guide reliefs which facilitate contact alignment during DIMM insertion.

Figure 10:
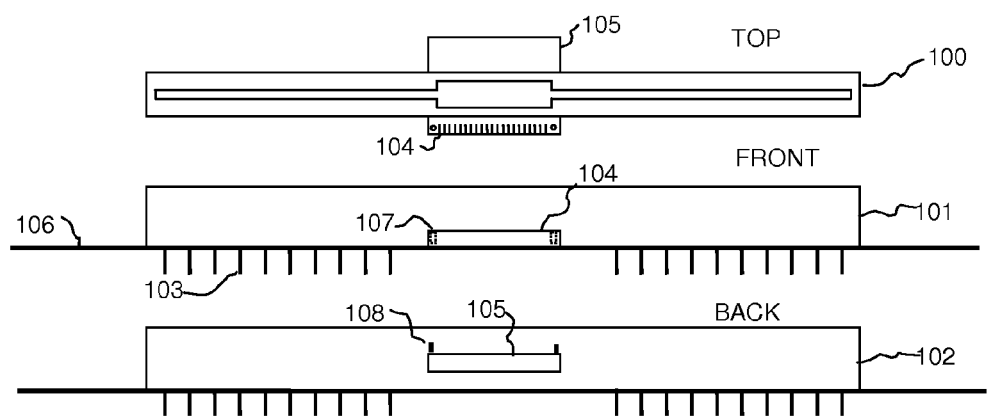
FIG. 10 illustrates a top and two side views of a DIMM connector with planar high frequency connections.
Figure 11:
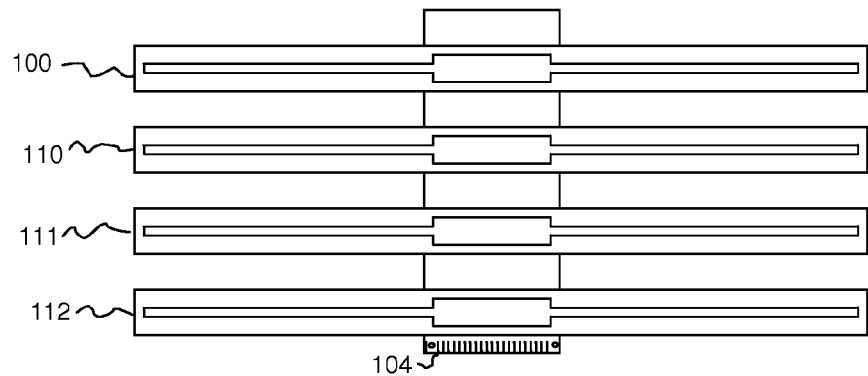
FIG. 11 illustrates a top view of ganged DIMM connectors with planar high frequency connections.

FIG. 10 illustrates an embodiment wherein a single DIMM connector 100 comprises a high frequency segment in the middle and two low density segments on either side. The embodiment accepts a DIMM with an attached signal adaptor 63. An alternate embodiment eliminates the requirement for a signal adaptor 63 on the DIMM 60. Alignment structures 107, 108 provide for accurate alignment of the high frequency segments when individual connectors 100 are placed next to each other. FIG. 11 further illustrates the embodiment comprising multiple connectors 100, 110, 111, 112 coupled to each other. Due to their shelf structures, the connectors must be installed in the order of 100 then 110, then 111 and finally 112. There are no limits to the number of connectors which may be chained together. The last connector in the chain 112 has an exposed connection shelf 104 (FIG. 10). This connection shelf is a available to connect signals into the PCB 106 (FIG. 10) with an additional adaptor or alternatively using others methods such as flex or cables.

Figure 12:
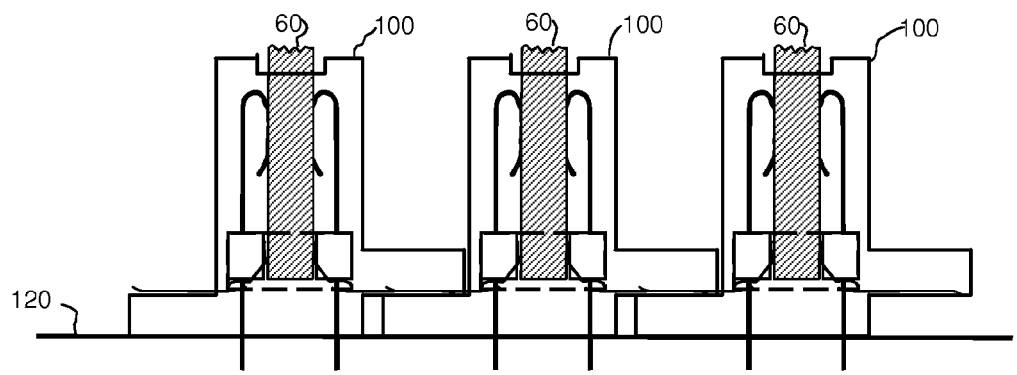
FIG. 12 illustrates a side view of ganged DIMM connectors with planar high frequency connections.

FIG. 12 illustrates a side view of the embodiment of ganged DIMM connectors with substantially planar high frequency connections.

Figure 13:
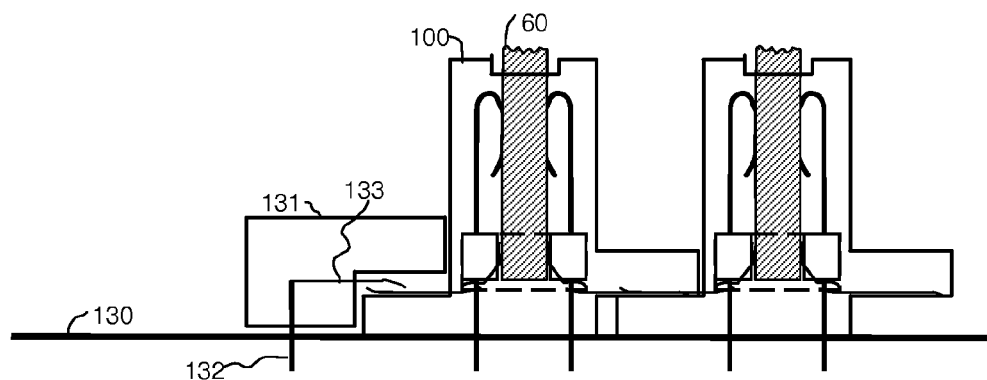
FIG. 13 illustrates a side view of ganged DIMM connectors with planar high frequency connections with a through-hole connector.

FIG. 13 illustrates a side view of the embodiment comprising ganged DIMM connectors with substantially planar high frequency connections with a through-hole connector 133 added to provide for connection to a PCB 130.

Figure 14:
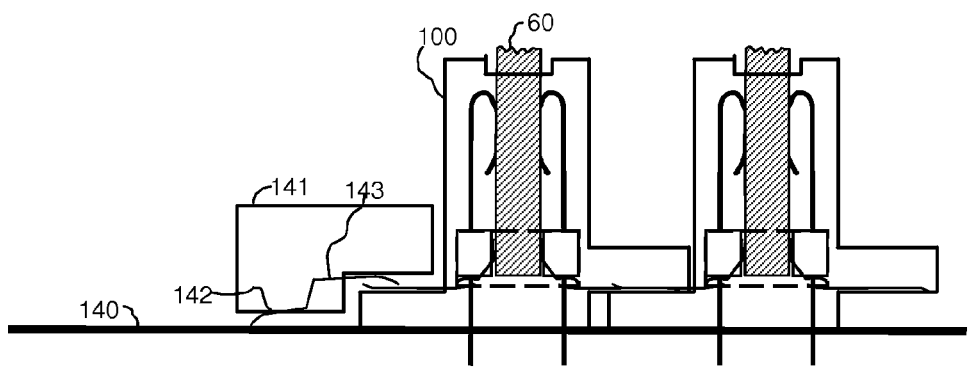
FIG. 14 illustrates a side view of ganged DIMM connectors with planar high frequency connections with a surface mount connector.

FIG. 14 illustrates a side view of the embodiment comprising ganged DIMM connectors with substantially planar high frequency connections with a surface mount connector 141 added to provide for connection to a PCB 140.

Figure 15:
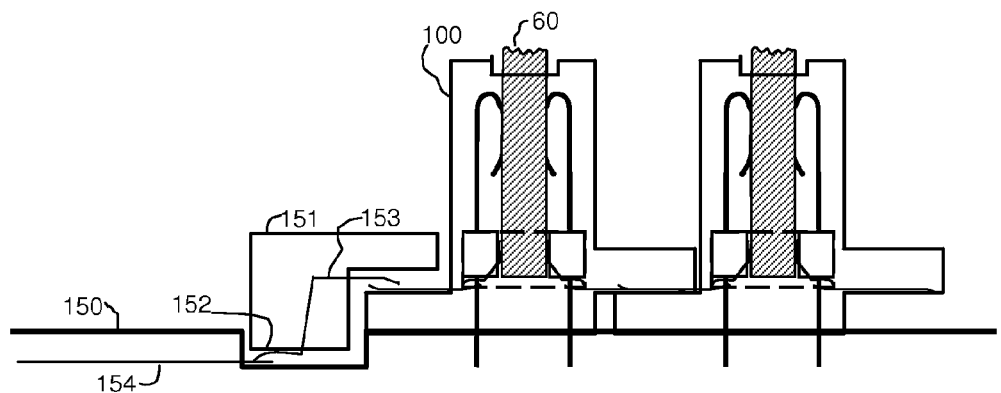
FIG. 15 illustrates a side view of ganged DIMM connectors with planar high frequency connections with a stair stepped surface mount connector.

FIG. 15 illustrates a side view of the embodiment comprising ganged DIMM connectors with substantially planar high frequency connections with a stair stepped surface mount connector 151 added to proved for connections to a PCB 150.

Figure 16:
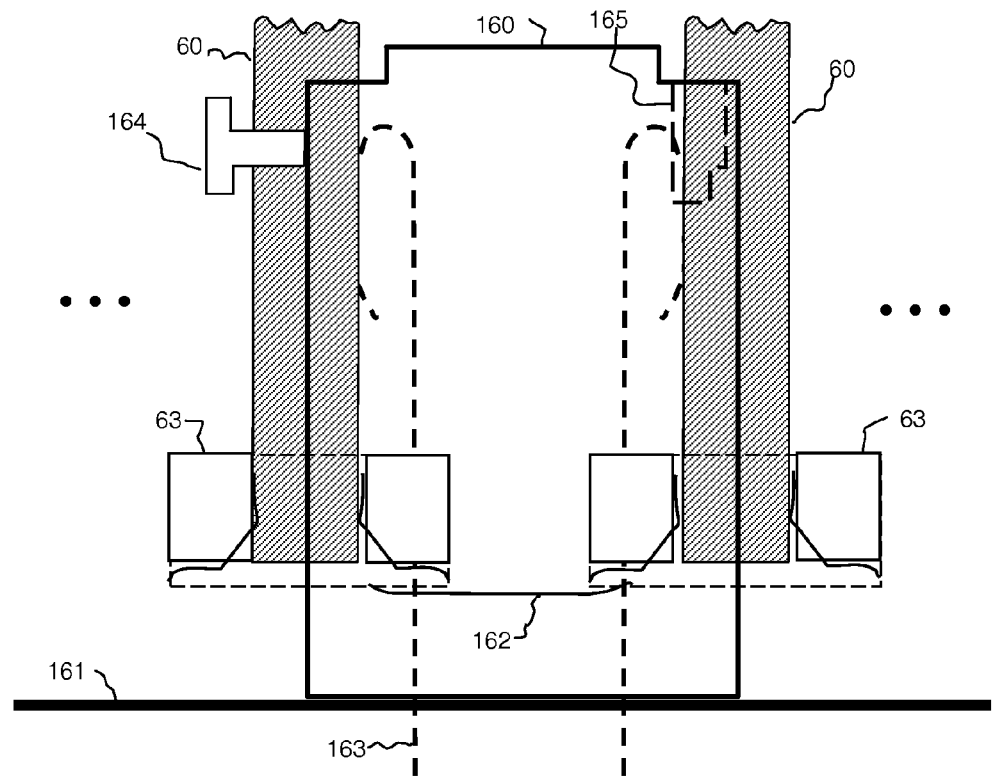
FIG. 16 illustrates a detailed side view of a high frequency planar DIMM connector where two separate DIMM modules are contacting a single memory connector element.
Figure 17:
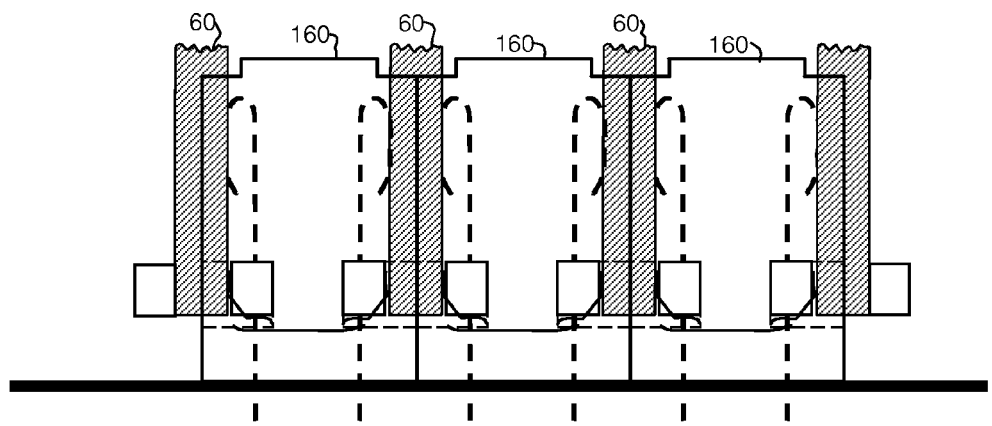
FIG. 17 illustrates multiple DIMM modules captured by multiple memory connector elements.

FIG. 16 illustrates a detailed side view of another embodiment of a high frequency planar DIMM connector wherein a connector is created which accepts a DIMM with an attached signal adaptor by the arrangement of two connector bodies 160. This embodiment is similar to the embodiment illustrated in FIG. 5 but allows for DIMMs with attached signal adaptors 63. FIG. 17 illustrates how multiple ganged connector elements 160 of the embodiment form an array of DIMM connectors. The connector bodies 160 are connected and aligned to each other through the use of an alignment and capture system such as the "nail-head" 243 and slot 350 arrangement illustrated in FIG. 35. These are specifically shown in FIG. 17 as a post 164 and a slot 165. Contact conductors 163 from the low density segment are shown for reference and are not part of the high frequency segment. FIG. 17 illustrates the embodiment as multiple DIMM modules captured by multiple memory connector elements.

Figure 18:
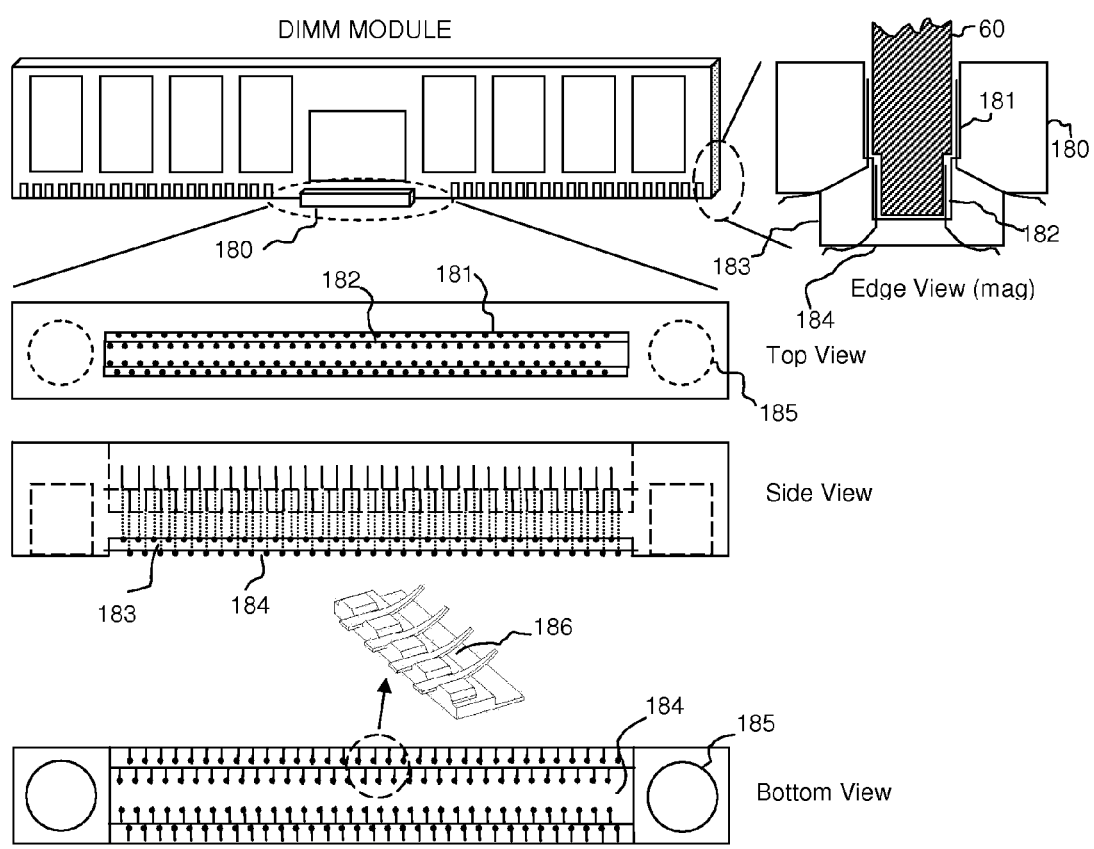
FIG. 18 illustrates a stair-stepped DIMM module signal adaptor.

Another embodiment of the invention is stair-stepped DIMM signal adaptor illustrated in FIG. 18. Similar to the embodiment of the signal adaptor illustrated in FIG. 9, this embodiment allows for multiple stair steps of connections. Even though FIG. 18 illustrates only two steps, multiple steps are anticipated. This embodiment allows for higher signal path density without reducing signal pitch. The stair-stepped DIMM signal adaptor is designed to mate to a DIMM connector with matching stair-steps.

Figure 19:
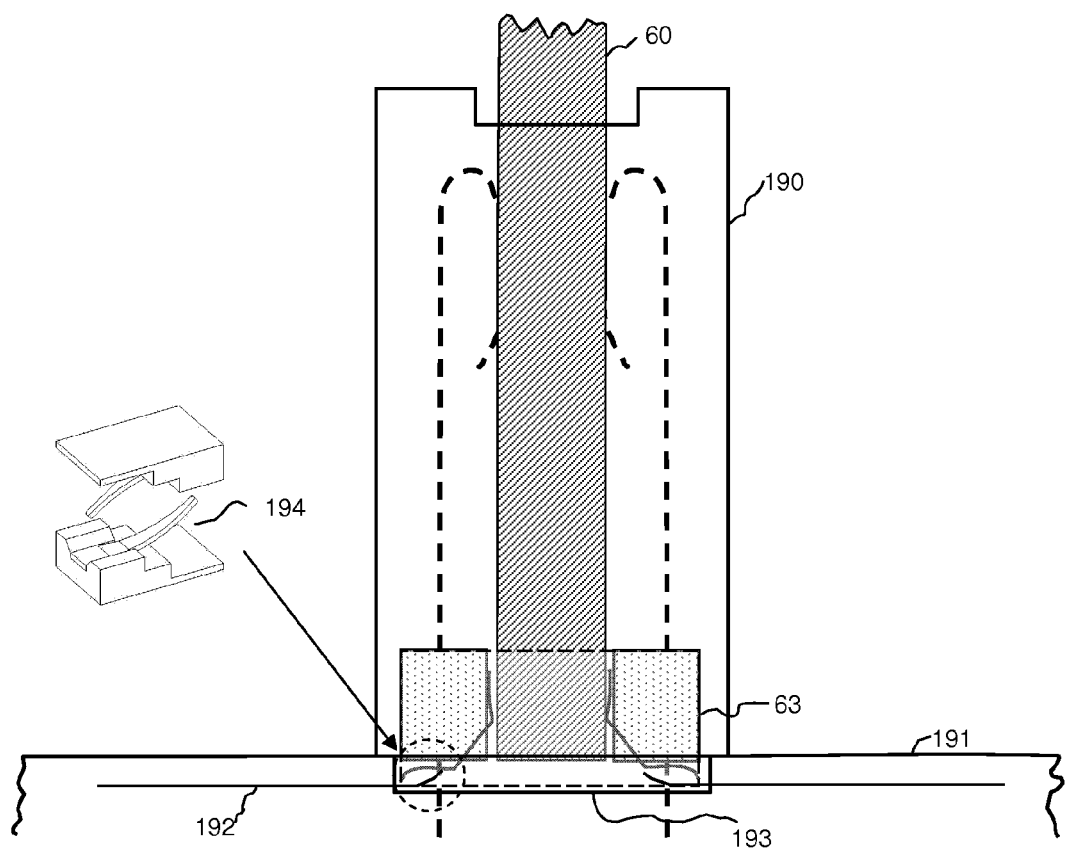
FIG. 19 illustrates a DIMM module with signal adaptor wherein signal connections are made directly onto a PCB.

Another embodiment of the invention is illustrated in FIG. 19 wherein a DIMM with signal adaptor 63 makes connections 194 directly onto a PCB 191. The connector element 190 provides for the alignment of the DIMM 60. As shown the signal adaptor 63 provides for a connection to a signal 192 below the exposed surface of the PCB 191. Other arrangements are possible such as directly connection to traces on top of the PCB. This embodiment also allows multiple levels (e.g. stair-stepped) of connections between the signal adaptor 63 and the PCB 191.

Figure 20:
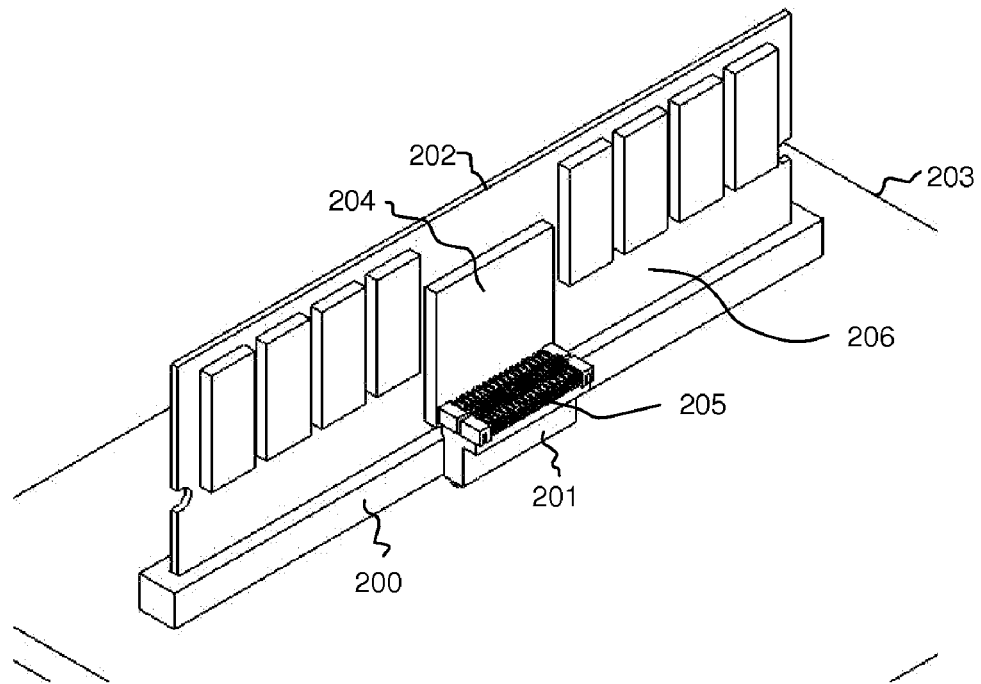
FIG. 20 illustrates a DIMM module with a high frequency signal interposer.

FIG. 20 illustrates another embodiment, a connector system in which low density signals are conducted to a DIMM 202 via a traditional DIMM connector structure 200 and high frequency signals are conducted to the DIMM 202 using an interposer 201. The interposer 201 contains a flexible circuit 205, which electrically interconnects electrical signals from DIMM 202 to the adjacent DIMM. The interposer 201 is shown without the adjoining (next in line) DIMM 202 that is in front of the connector 200. This interposer connection method allows the interposer 201 to directly connect to the DIMM PCBPCB substrate material, or alternatively, as depicted in FIG. 20, to the IC package 204 mounted on DIMM 202.

Figure 21:
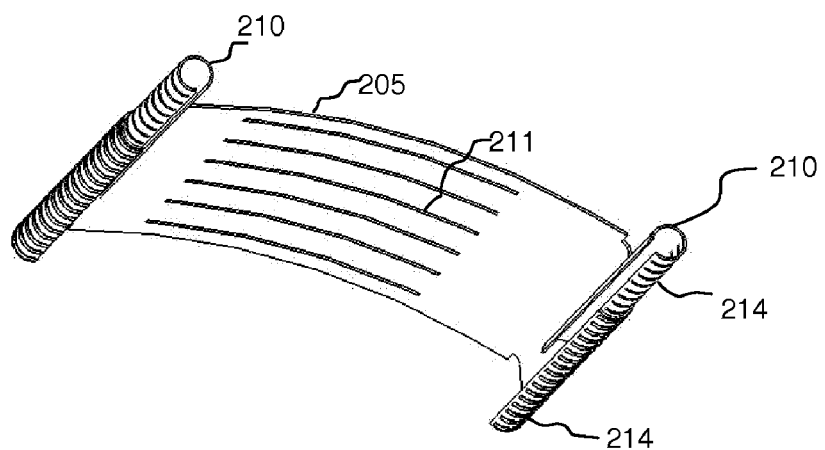
FIG. 21 illustrates a flexible circuit without the contact housings and with the cylindrically-shaped, slotted springs.

FIG. 21 illustrates a detailed view of the interposer's flexible circuit 205. The interposer 201 may interconnect any electronic components with suitable alignment features and contact pads. FIG. 21 illustrates the flexible circuit 205 with the cylindrically-shaped, slotted springs 210 withdrawn partially from inside the flexible circuit's contacts. The springs 210 provides contact force for the flexible circuit contacts. Slots 214 in both springs 210 and between the contacts in the flexible circuit 205 provide independent movement of the contacts so that any stiffness in the flexible circuit does not hinder contact force in adjacent contacts.

Figure 22:
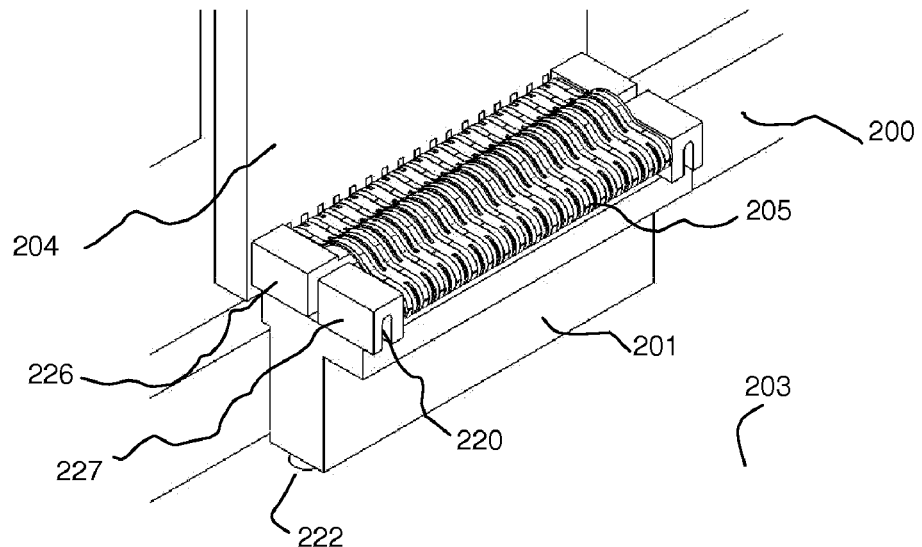
FIG. 22 illustrates a close up view of a DIMM interposer with down facing engagement slots.

FIG. 22 illustrates a close-up of the flexible circuit 205 interposer 201. The alignment slots 220 slide over nail heads 243 (in FIG. 24) on the IC package 204 and nail heads 244 (in FIG. 24) on the back of the adjacent DIMM card. The interposer 201 is assembled onto the PCB 203 (FIG. 20) using prongs, other protrusions or other assembly methods 222. The contact housings 226, 227 have the ability to move freely to allow slot/hole alignment. In this embodiment, the DIMM 202 is required to be installed prior to the installation of the interposer 201.

Figure 23:
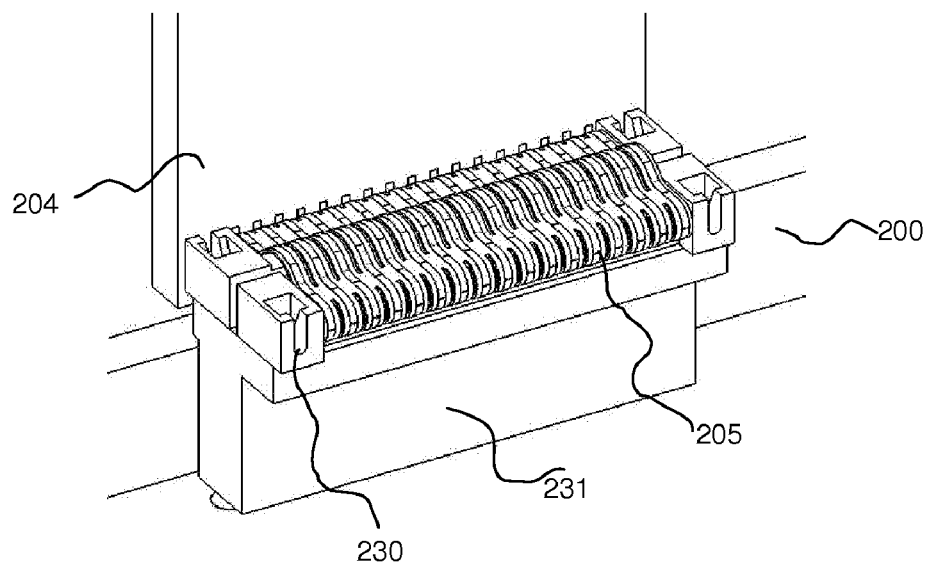
FIG. 23 illustrates a close up view of a DIMM interposer with up facing engagement slots.
Figure 24:
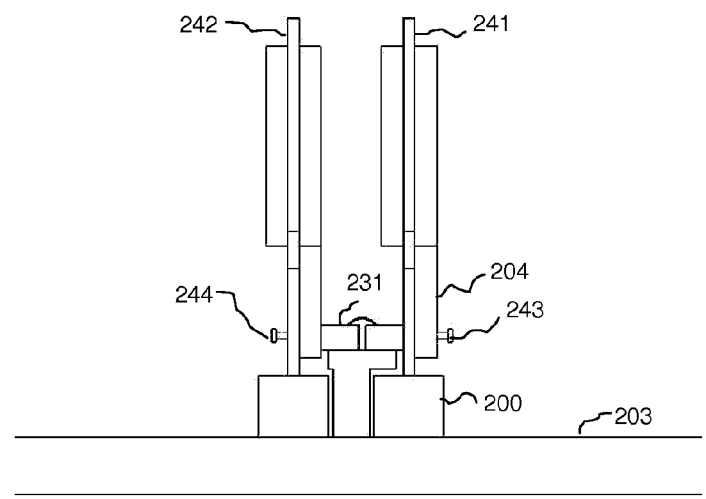
FIG. 24 illustrates a side view of a DIMM interposer placed between two DIMMs.
Figure 25:
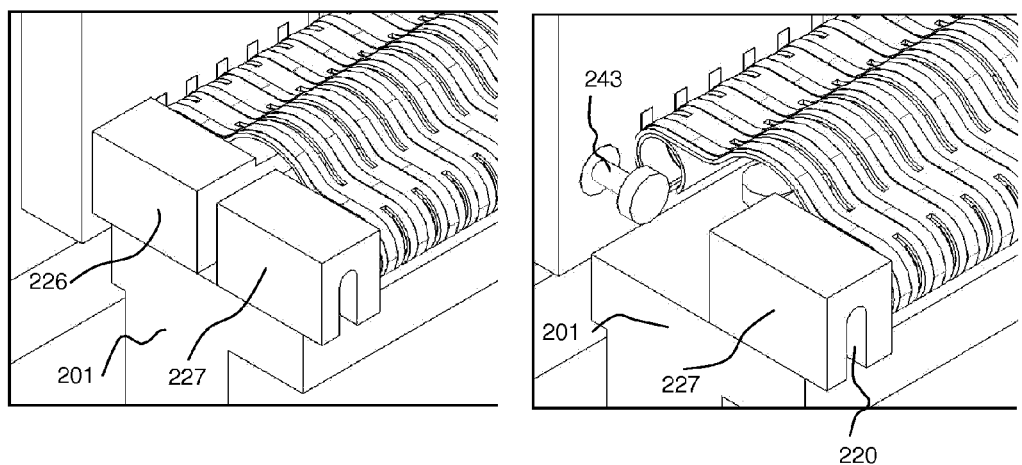
FIG. 25 illustrates details of a DIMM interposer pin and slot alignment mechanism.
Figure 26:
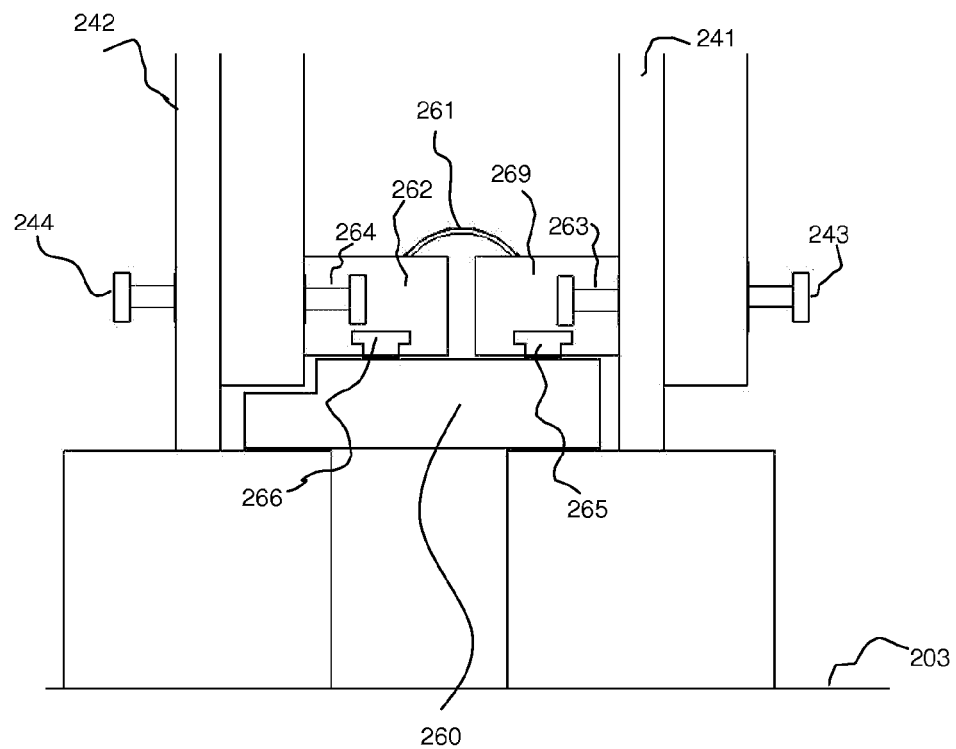
FIG. 26 illustrates a side view of a DIMM interposer which allows for horizontal alignment.

In an alternative embodiment shown in FIG. 23, the slots 230 for capturing the nail heads 243, 244 (in FIG. 24) are facing upwards allowing the DIMM 202 to be inserted after the interposer 231. FIG. 24 is a side view of the interposer 231 illustrating its relationship to the DIMM cards and standard DIMM connectors 200. FIG. 25 contains two close up views of the contact housings 226, 227. The first view show both contact housings 226, 227 and the second view shows the interposer 201 without the contact housing 226 to show the nail head 243 on the substrate package. FIG. 26 illustrates one of the feature of the embodiment for aligning tight pitch signals in situations where untrained persons are allowed to install modules. The interposer 260 is fixed to the PCB 203 and is not movable. However, the nail-head and slot system 265, 266 provide for the connector bodies 262, 269 to move independently in the direction along the length of the DIMM 241, 242. Independently, the nail-head and slot systems 263, 264 provide the alignment necessary to make high pitch signal connections. The flexible circuit 261 shown in FIG. 26 is displayed as being routed over the top of the interposer. However, they may be also routed under the contact housings.

Figure 27:
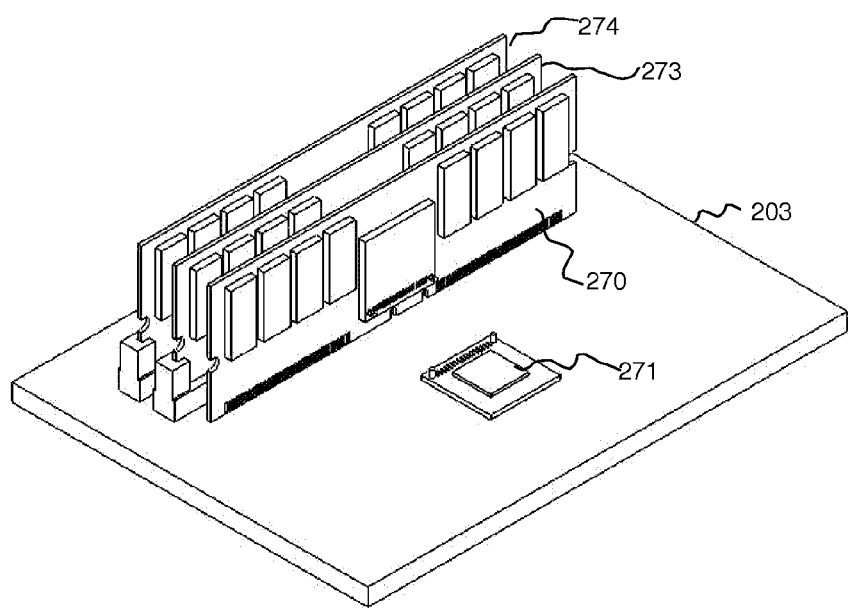
FIG. 27 shows DIMM cards with the first DIMM connector removed for clarity in showing the first card
Figure 28:
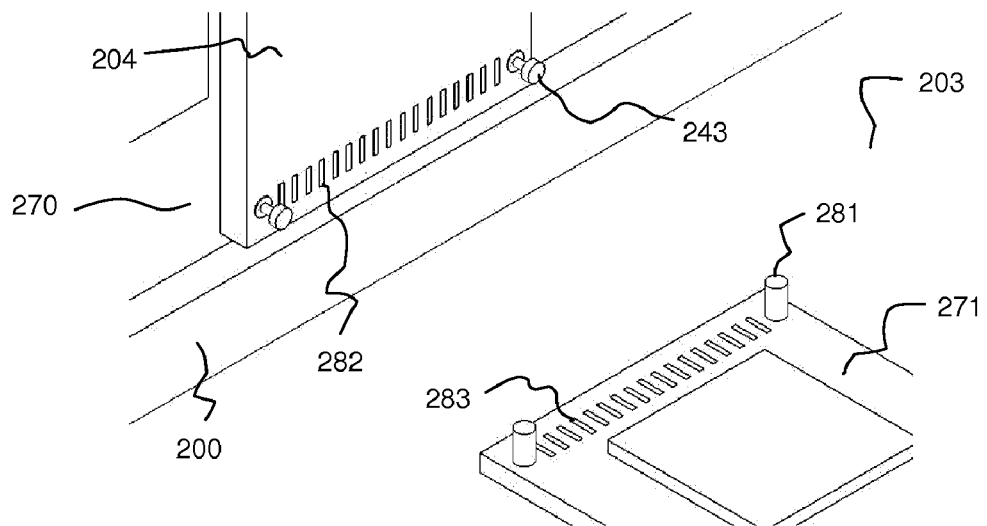
FIG. 28 is a closeup view showing the contact pads and alignment features on top of the advanced memory buffer (AMB) IC package on the DIMM card and the controller IC package on the backplane.

FIG. 27 illustrates a DIMM array 270, 273, 274 wherein the first DIMM 270 is not attached to an interposer but is required to be connected to a device 271 mounted on the PCB 203. FIG. 28 illustrates a close up of FIG. 27 showing the electrical contact pads 282, 283 and alignment features 243, 281 on the IC package 204 and device 271.

Figure 29:
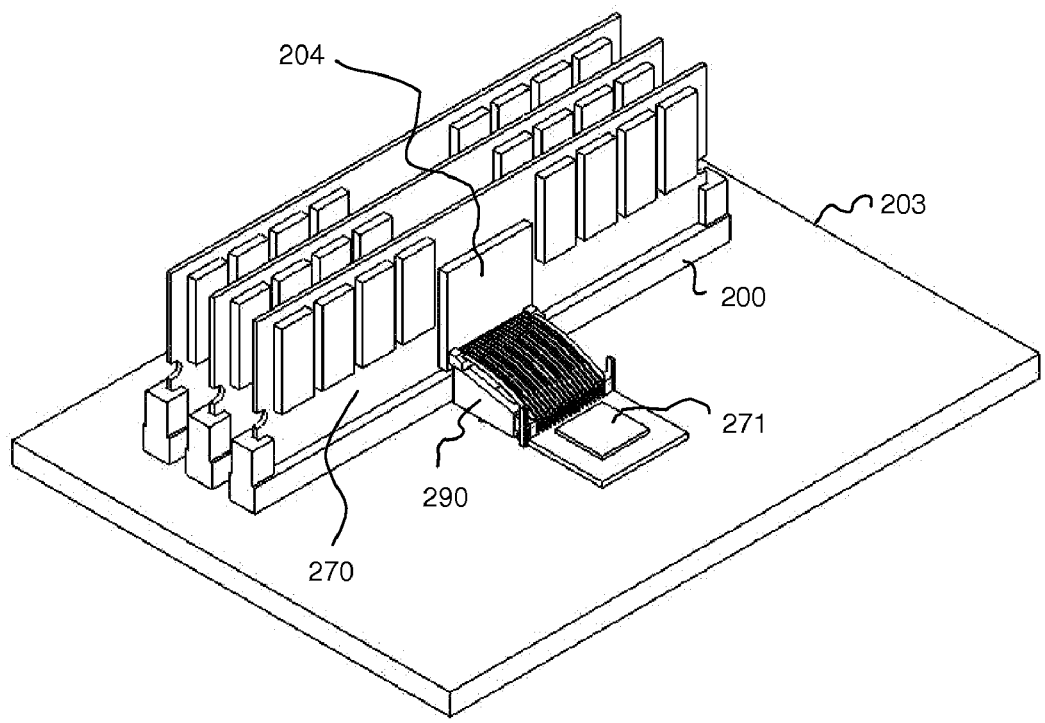
FIG. 29 illustrates a flexible circuit connector that connects the DIMM IC package to the controller IC package.
Figure 30:
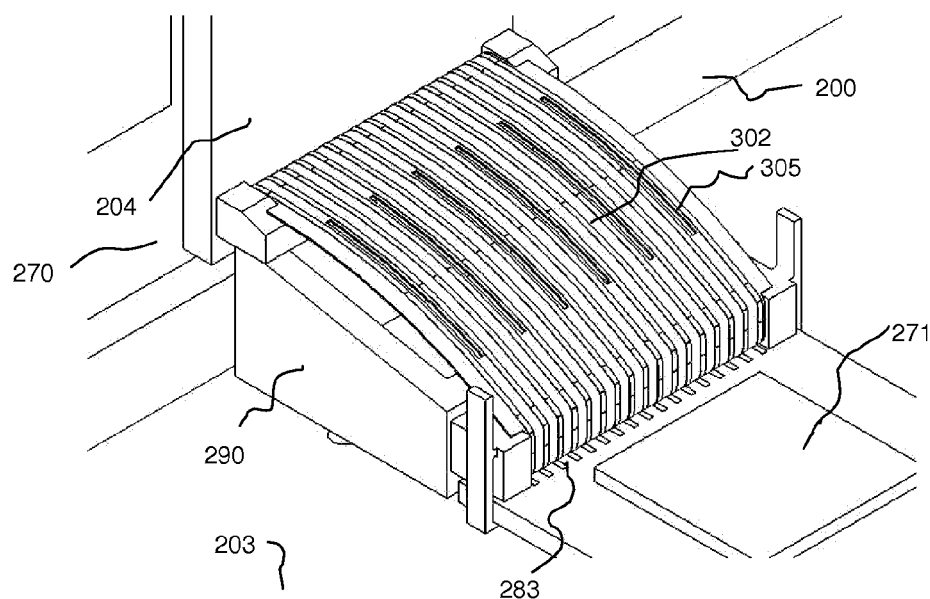
FIG. 30 is a close up view of FIG. 29 illustrating the slots between the signal traces on the flexible circuit.
Figure 31:
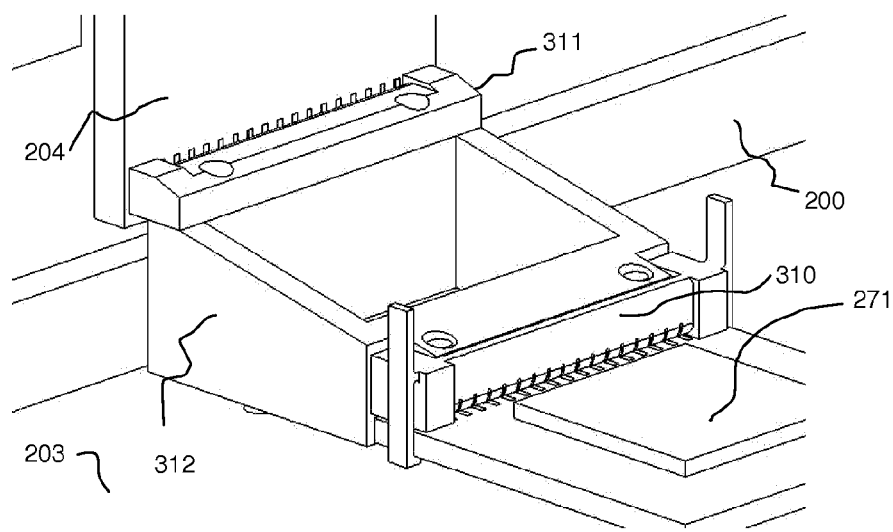
FIG. 31 another view of FIG. 30 except with the flexible circuit removed to show the underlying connector structure.
Figure 32:
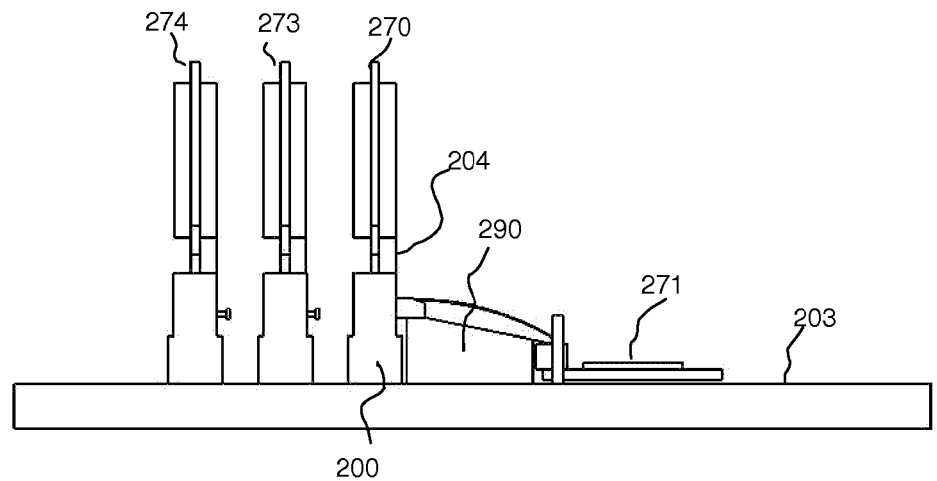
FIG. 32 is a side view of the connector showing all the DIMM cards and standard DIMM connectors.
Figure 33:
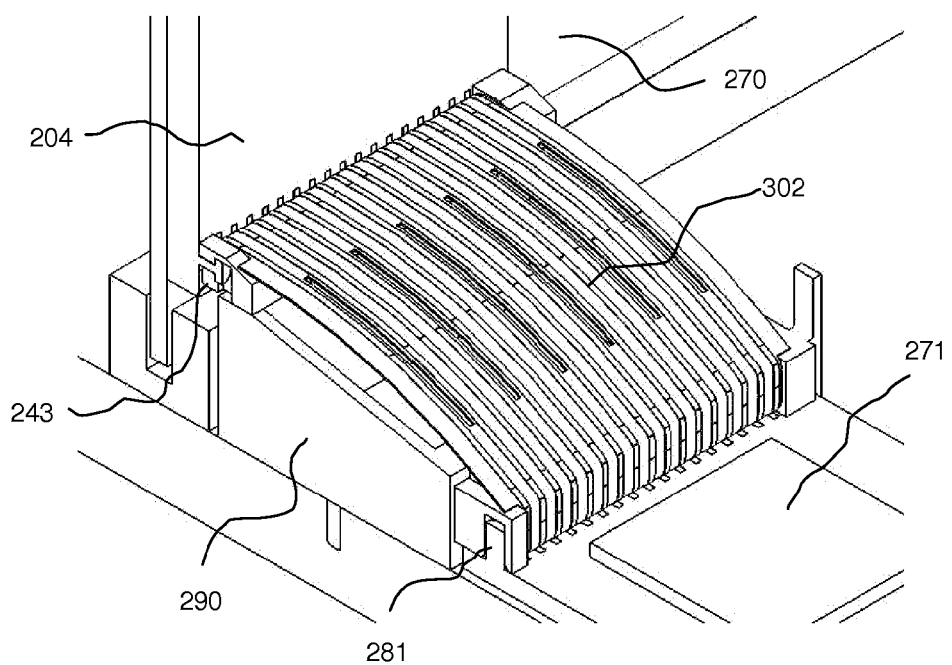
FIG. 33 is a cutaway view illustrating the alignment features, which are slots going over nail-heads on the AMB IC package on the DIMM card to the left and a hole going over an alignment pin on the controller IC package on the right.
Figure 34:
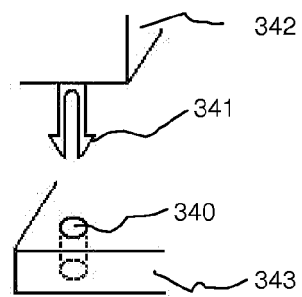
FIG. 34 illustrates an alternate alignment mechanism.
Figure 35:
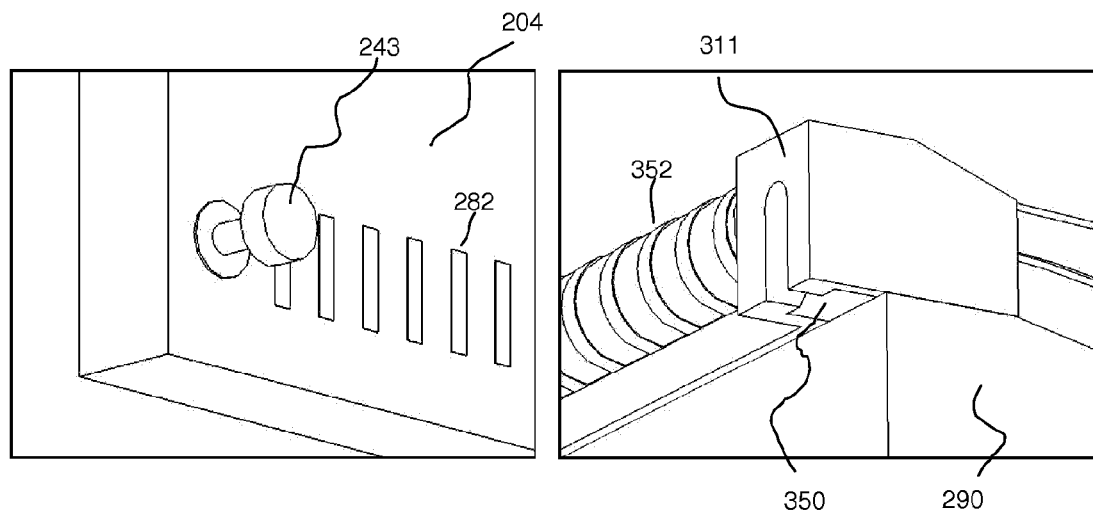
FIG. 35 illustrates the nail head on the DIMM IC package and the alignment slot that is on both sides of the contact housing in the flexible circuit connector.
Figure 36:
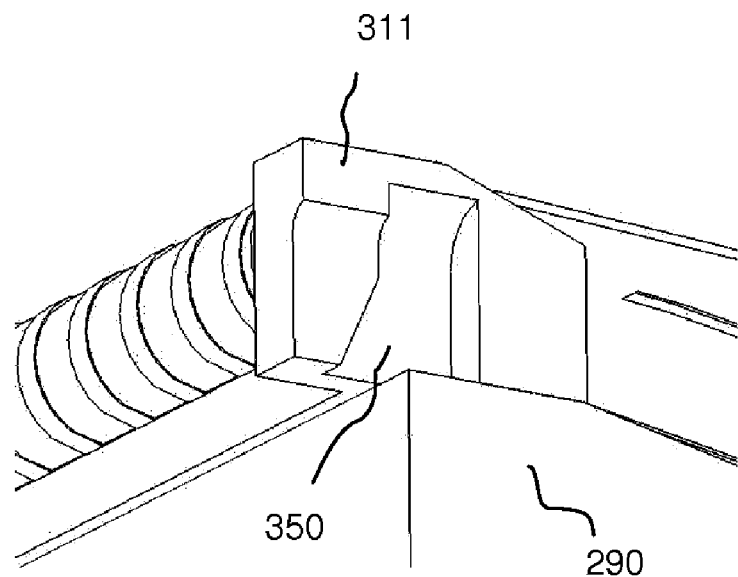
FIG. 36 illustrates a cutaway view of the slot in the flexible circuit connector's contact housing.
Figure 37:
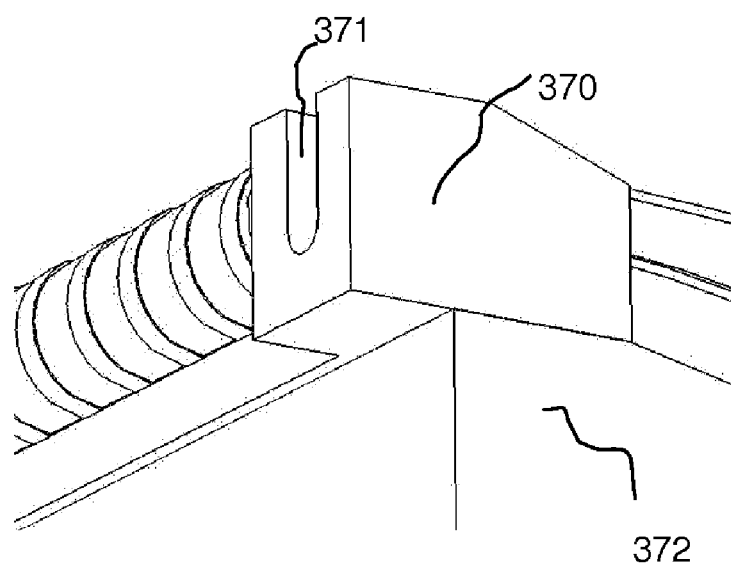
FIG. 37 illustrates a contact housing with alignment slot opening upward.
Figure 38:
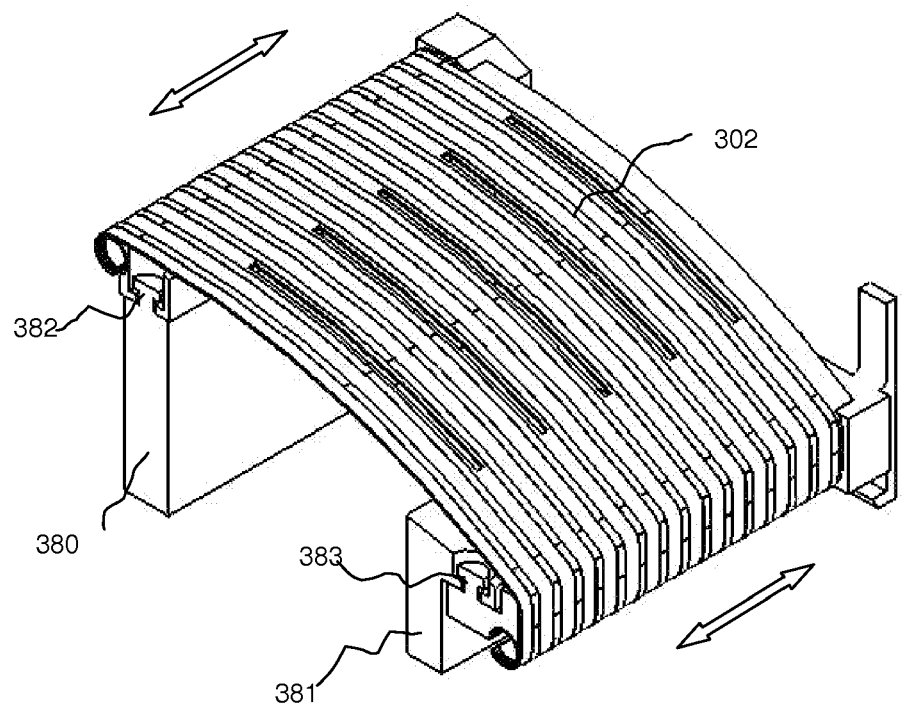
FIG. 38 illustrates a cutaway view of the nail head/hole features.
Figure 39:
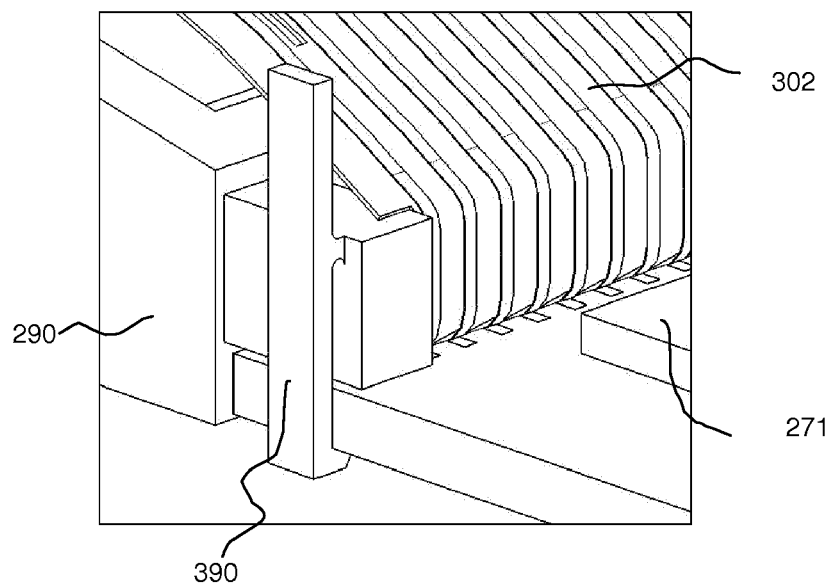
FIG. 39 illustrates clamping levers on both sides of the flexible circuit's contacts.
Figure 40:
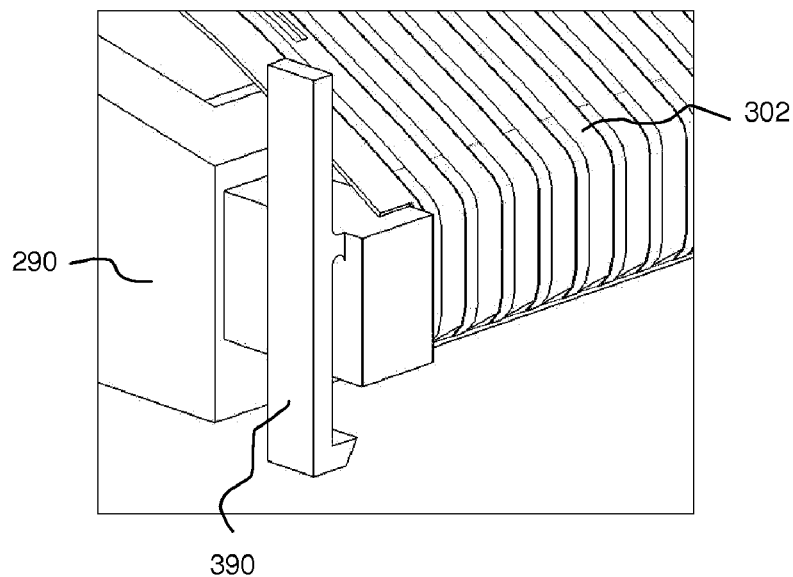
FIG. 40 illustrates clamping levers without a controller IC package for clarification.
Figure 41:
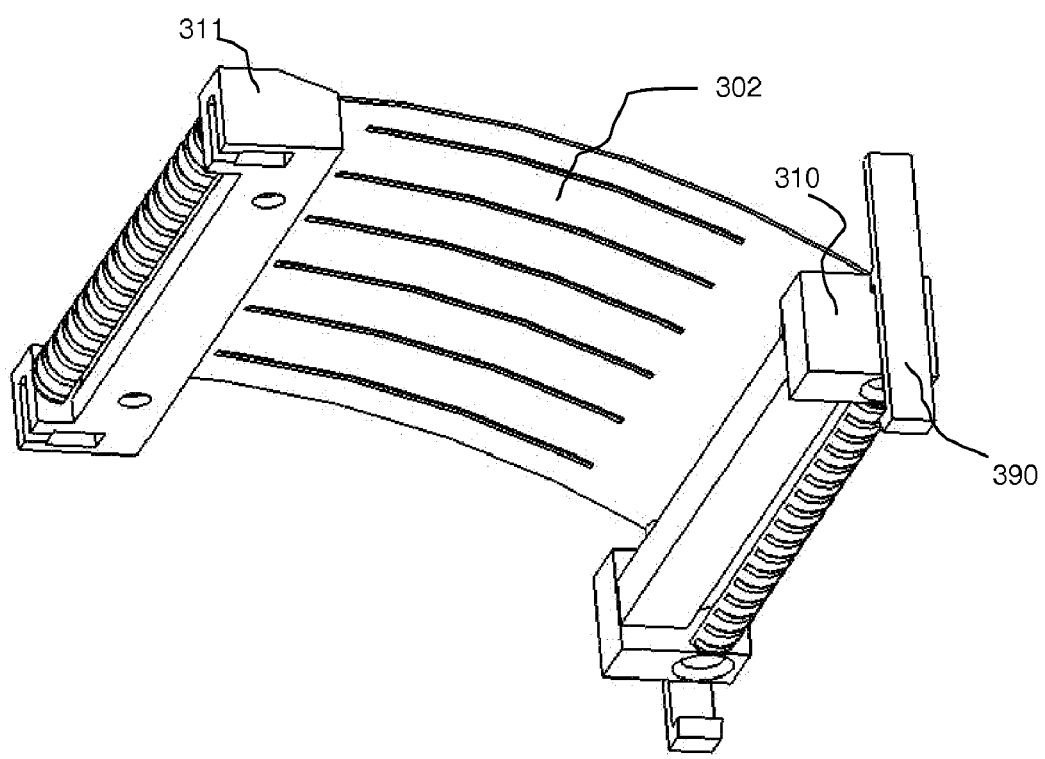
FIG. 41 illustrates an underside view of the flexible circuit and contact housings with the base removed for clarity.

Another embodiment is illustrated in FIG. 29 wherein instead of an interposer connecting two DIMMs, flexible circuit connector 290 connects the DIMM 270 to a package 271 on a PCB 203 is presented. FIG. 30 illustrates a flexible circuit connector 290 that connects a IC package 204 on the DIMM 270 to n an IC package 271 mounted on a PCB 203. The connector is capable of interconnecting any other electronic components. The connections are made directly from the tops of the chip packages. The embodiment may be further refined and applied to any other type of integrated circuit package having any other electronic function. The two IC packages used as examples are physically close to each other. However, any IC packages may be farther distant and may be interconnected by lengthening the flexible circuit between the contacts, which creates flexible circuit cable. FIG. 30 provides a close up view of the signal paths illustrating the slots 305 between the signal traces on the flexible circuit 302. These slots enhance the ability of either end of the flexible circuit to move with respect to each other so that the contact housing's alignment features at either end of the connector may move freely to align the contact pads and contacts to each other. The signal traces may be single-ended or differential pairs with a ground plane as part of the flexible circuit. FIG. 31 is the same as the FIG. 30 except with the flexible circuit removed to show the underlying connector structure. The structure is composed of 1) a base 312 that may plug into or fasten to the PCB 203 and 2) contact housings 310, 311 that align the flexible circuit's contacts to the contact pads on either package 271, 204. FIG. 32 is a side view of the flexible circuit connector 290 showing DIMM cards 270, 273, 274 and standard DIMM connectors 200. This Figure illustrates how the flexible circuit connector 290 may be assembled onto both IC packages in one downward movement by an assembler or a pick and place machine. FIG. 33 is a cutaway view of the flexible circuit connector 29290 illustrating the alignment features, which are slots going over nail-heads 243243 on the IC 204 package 204 on the DIMM card 27270 and a hole going over-alignment pins 28281 on the controller package 271. The holes and alignment pins on the controller chip may be reversed. The embodiment is not limited to this means of alignment but may include many others. For instance, as illustrated in FIG. 34, the contact housing 342 may have a two branched prong 341 that is inserted into a hole 340 in the IC package 343. Each branch of the prong may bend inward as it is inserted into the hole and then a lip on the prong catches or is held in place at the bottom of the hole. FIG. 35 illustrates two views of the nail head 243 on IC package 204 and the alignment slot 350 that are on both sides of the contact housing 311 in the flexible circuit connector 290. The contact housing's alignment slot 350 is canted inside its cavity so that as the slot passes over the nail head 243, the canted surface slides over the back surface of the head on the nail head. This action draws the flexible circuit connector's electrical contacts 352 toward the contact pads 282 on the package 204, thus providing contact force between the contact pads 282 and the electrical contacts 352. FIG. 36 is a cutaway view of the slot 350 in the flexible circuit connector's contact housing 31311. It shows the canted surface 350 mentioned in the previous paragraph. FIG. 37 shows an orienting of the alignment slot 371 opening 180 degrees upward from that in the previous Figures. This allows the flexible circuit connector 372 to be assembled to the PCB 203 after the standard DIMM connector 200 is in place. The DIMM 270 may be inserted into the standard DIMM connector 200 which simultaneously allows insertion of the IC package's alignment nail heads into the flexible circuit connector's alignment slot 371. FIG. 38 illustrates a cutaway view of the nail head-to-hole alignment features (4 each in this example) 382, 383 that allow the flexible circuit's electrical contacts to move freely with respect to the base 380, 381, thus allowing the previously described alignment features to align the flexible circuit's electrical contacts with the corresponding electrical contact pads on the IC packages. FIG. 39 illustrates the clamping levers 390 on both sides of the flexible circuit's electrical contacts. The clamping levers slide over the sides of the controller chip package 271 and clamp to the IC package's bottom side. This action provides contact force between the flexible circuit's electrical contacts and the electrical contact pads on the IC package 271. FIG. 40 illustrates the clamping lever 390 without the IC package 271 for clarification. FIG. 41 shows an underside view of the flexible circuit 302 and contact housings 310, 311 with the base removed for clarity.

Figure 42:
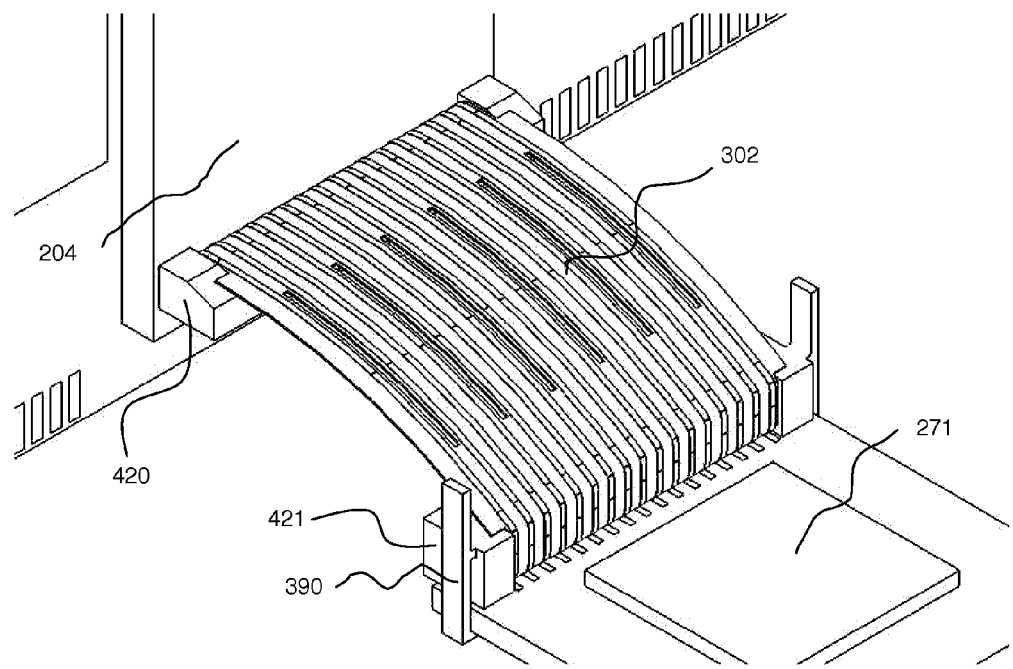
FIG. 42 illustrates the flexible circuit connector without the base.

FIG. 42 illustrates another embodiment wherein the flexible circuit connector 302 is used without a base so that an assembler or pick-and-place machine may separately or simultaneously assemble each contact housing 420, 421 to either IC package 204, 271. The flexible circuit acts like a cable and strain relief providing the greatest ability to connect two components together when they are at greatly varying distances and angles from each other.

Figure 43:
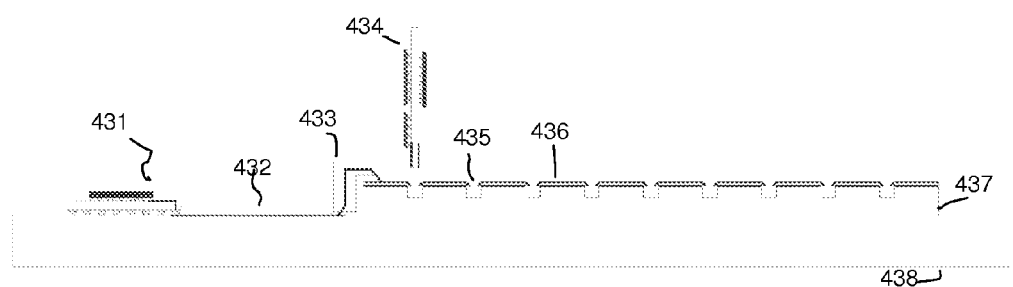
FIG. 43 illustrates sectional view of central portion of multi-slot connector where connection to driver/controller chip is made through package.
Figure 44:
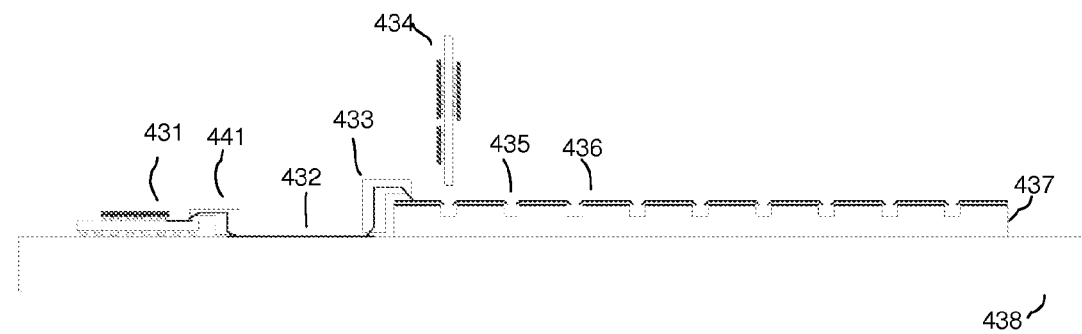
FIG. 44 illustrates sectional view of central portion of multi-slot connector where connection to driver/controller is made through upper surface of package.

FIG. 43 illustrates an embodiment wherein the high frequency (high frequency) portion 437 of a multi-slot connector is formed as a single piece. Low density elements may be mounted as necessary on both sides of the high frequency multi-slot connector. In this embodiment, connection to driver/controller is made through an additional connection to the PCB board 438 and over to the driver controller 431 through standard PCB connection techniques. The embodiment illustrated in FIG. 44 is similar to the embodiment in FIG. 43 except the connection to the driver/controller is made from the top of that device through an additional connector 441.

Figure 45:
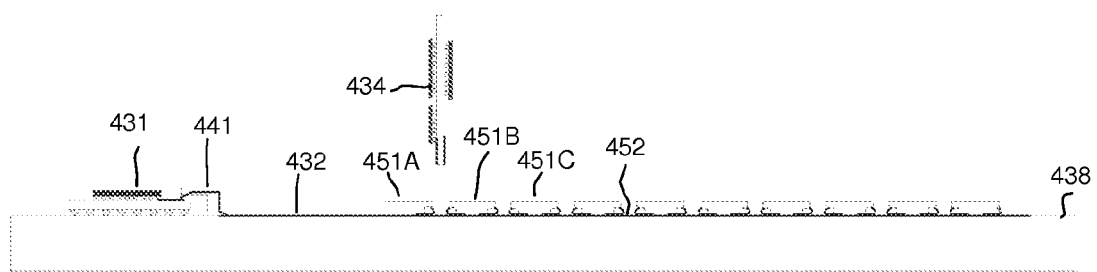
FIG. 45 illustrates a sectional view of central portion of multi-slot connector where channel is maintained on surface of PCB.

FIG. 45 illustrates another embodiment of the invention wherein the channel is maintained on the surface of the PCB 432, 452. High frequency (high frequency) connector elements 451A, 451B, 451C are placed individually along the PCB.

Figure 46:
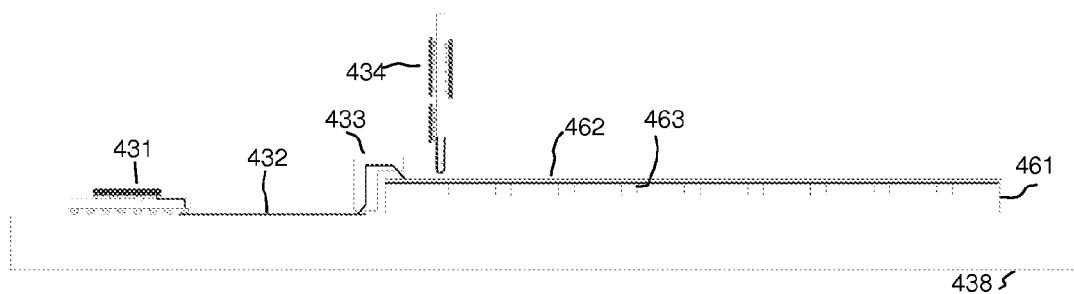
FIG. 46 illustrates a module with circuits wrapping around its end to interface with a compliant controlled impedance bus.

FIG. 46 illustrates another embodiment wherein a single continuous channel is constructed by use of a flexible bus 462. The bus bridges cavities 463 which are available for a DIMM 434 to push the flexible bus into during insertion.

Figure 48:
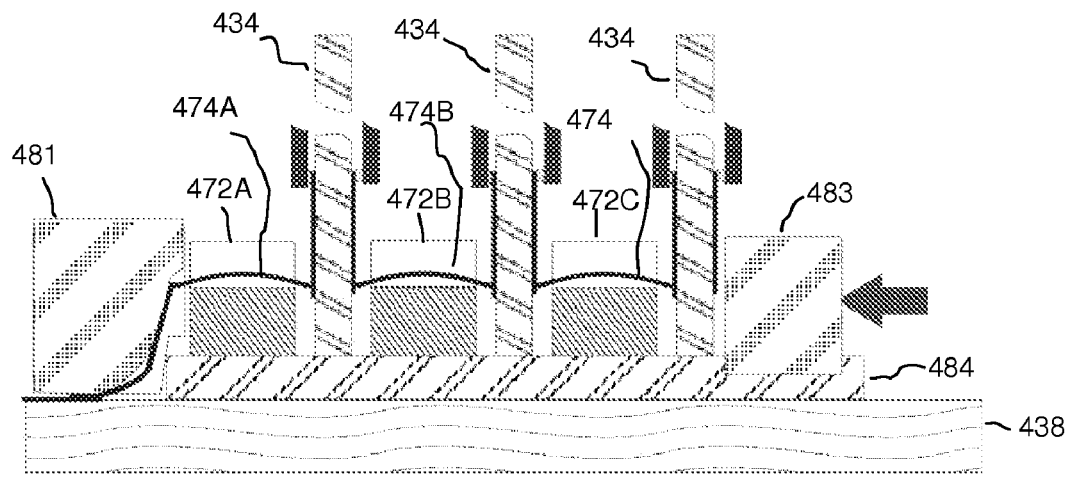
FIG. 48 illustrates an embodiment of Section AA showing how a buckling beam may be used to make contact by applying lateral force.
Figure 49:
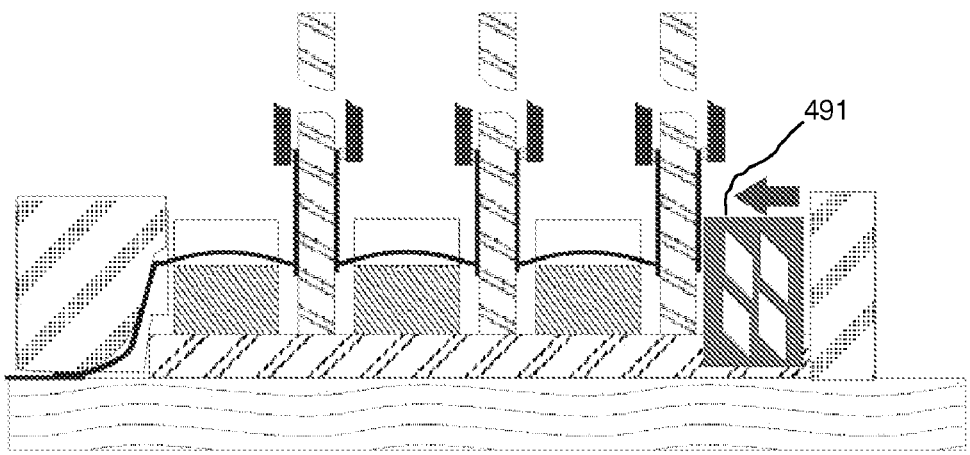
FIG. 49 illustrates another embodiment of Section AA showing how a buckling beam and a force delivery may be used to make contact by applying lateral force.

FIG. 46 illustrates a perspective view on another embodiment making use of springs for contacts for both high and low density areas as well as vertical and horizontal signal path connections. This embodiment is similar to the embodiment illustrated in FIG. 17 wherein the actual memory module insertion cavity is formed by two connector bodies 472A, 472B. An advantage to this embodiment is that insertion of modules requires no force and maintains simple memory module design. Springs make contact both laterally and down providing for both daisy-chained and bussed signaling. The magnified insert shows examples of spring embodiments. The high frequency spring 474A allows for direct passage of signals between DIMMs. The low density spring 473 provides for a signal path from the DIMM to the bottom of the connector body 472A, 472B. FIGS. 48 and 49 illustrate a section of AA on how a buckling beam may be used to make contact by applying lateral force. FIG. 49 includes a compressible spring force element 491.

Figure 47:
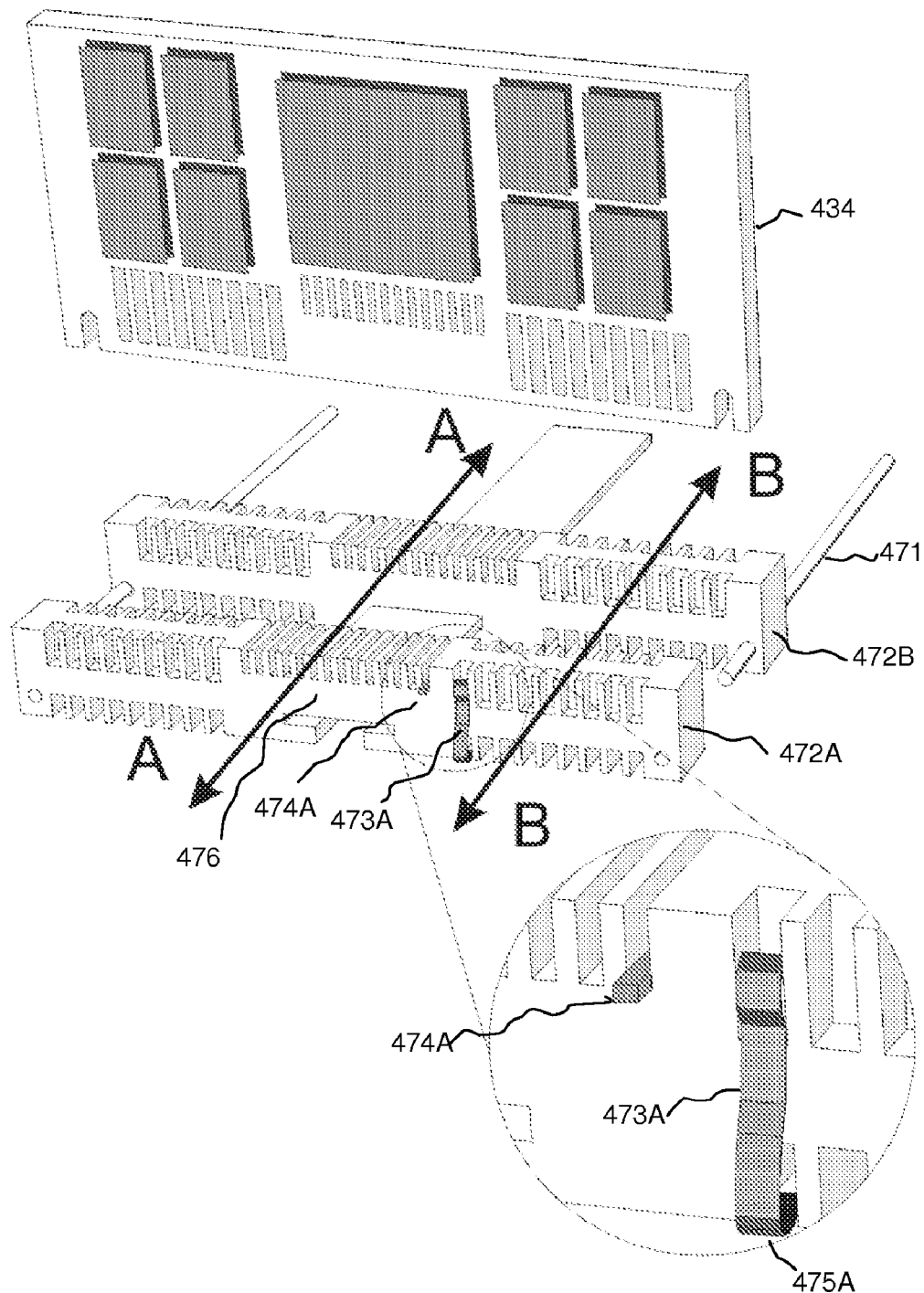
FIG. 47 illustrates a perspective view of an embodiment having spring arrangements for both high and low density areas.
Figure 50:
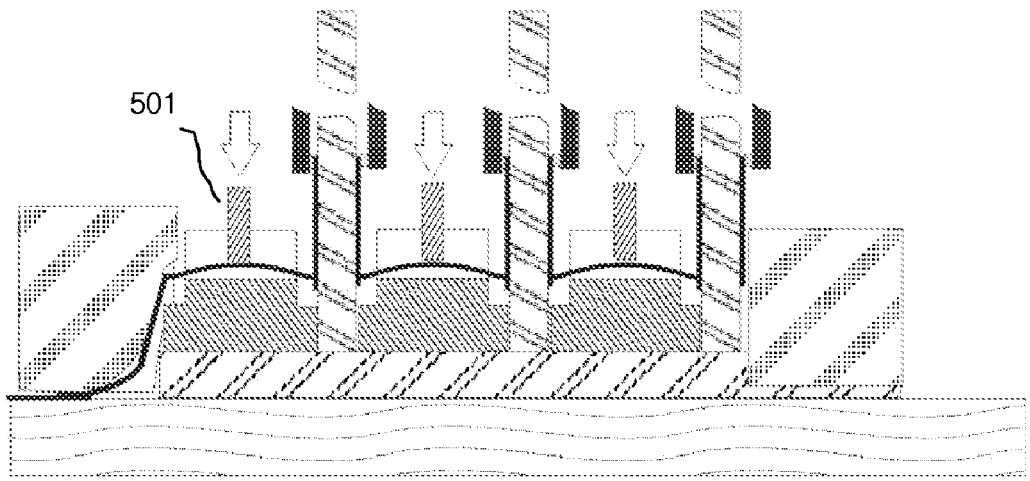
FIG. 50 illustrates an embodiment of Section AA showing how a buckling beam may be used to make contact by applying vertical force from above.

FIG. 50 illustrates another embodiment of the invention shown in FIG. 47, including a buckling beam used to make contact by applying vertical force 501 from above.

Figure 51:
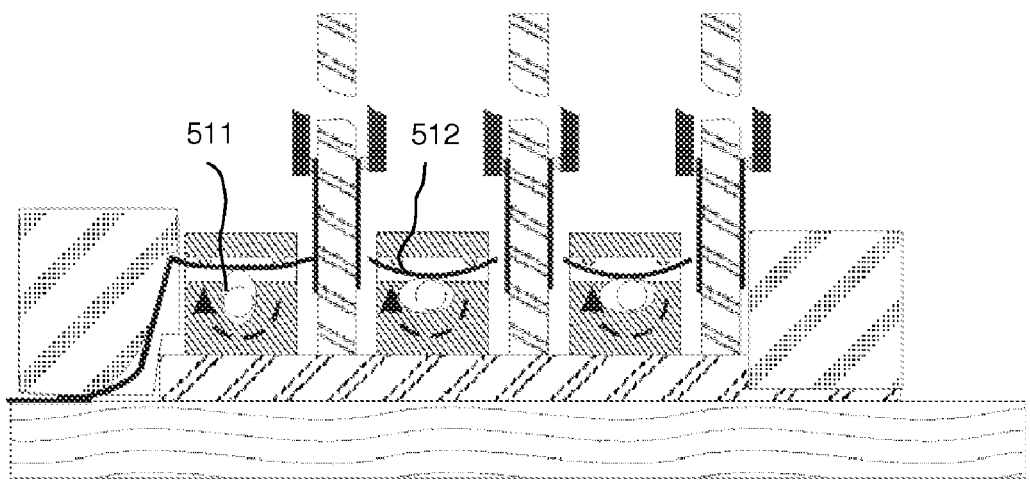
FIG. 51 illustrates and embodiment of Section AA showing how a buckling beam may be used to make contact by applying vertical force from below by means of a cam.

FIG. 51 illustrates another embodiment of the invention shown in FIG. 47, including a buckling beam used to make contact by applying vertical force from below by means of a cam 511. The far left cam 511, on FIG. 51 shows how the turning of the cam straightens the bent wire to force engagement, while those on the right 512 show the unengaged positions.

Figure 52:
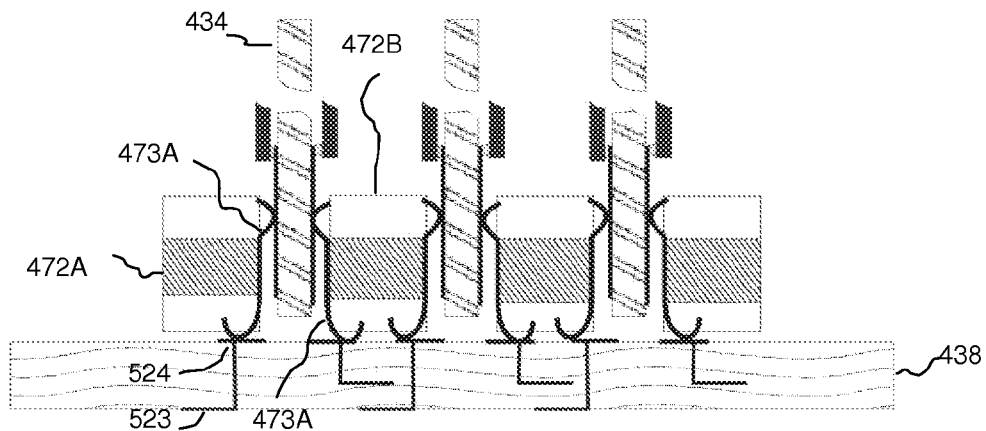
FIG. 52 illustrates an embodiment of Section BB showing how springs may make contact both laterally and vertically.

FIG. 52 illustrates an embodiment of the invention shown in FIG. 47, including springs 473A, 473B that make contact in both lateral and vertical directions. Downward force from above forces engagement of contacts in both course and fine contact areas. The downward force may be generated from, cut is not limited to, a cam, a pressure plate or a lever.

Figure 53:
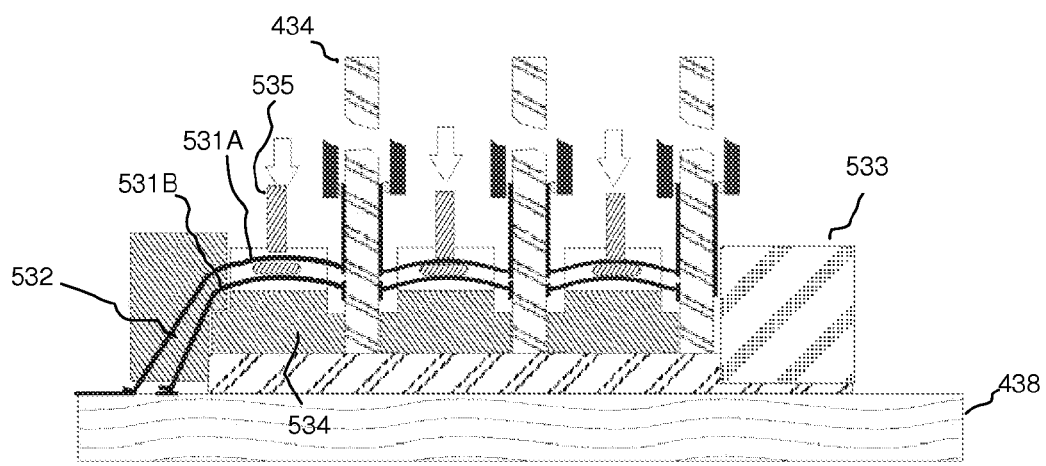
FIG. 53 illustrates an embodiment of Section AA showing an array of buckling beams may be disposed to make array contacts on the module to increase signal density and larger feature sizes.

FIG. 53 illustrates an embodiment of the invention shown in FIG. 47, including an array of buckling beams 531A, 531B disposed to make array contacts on the module 434 to increase signal density and allow larger conductor feature sizes. An alternate embodiment of a buckling beam is the use of impedance controlled connections such as, but not limited to, coax, twinax, or ribbonized conductors.

Figure 54:
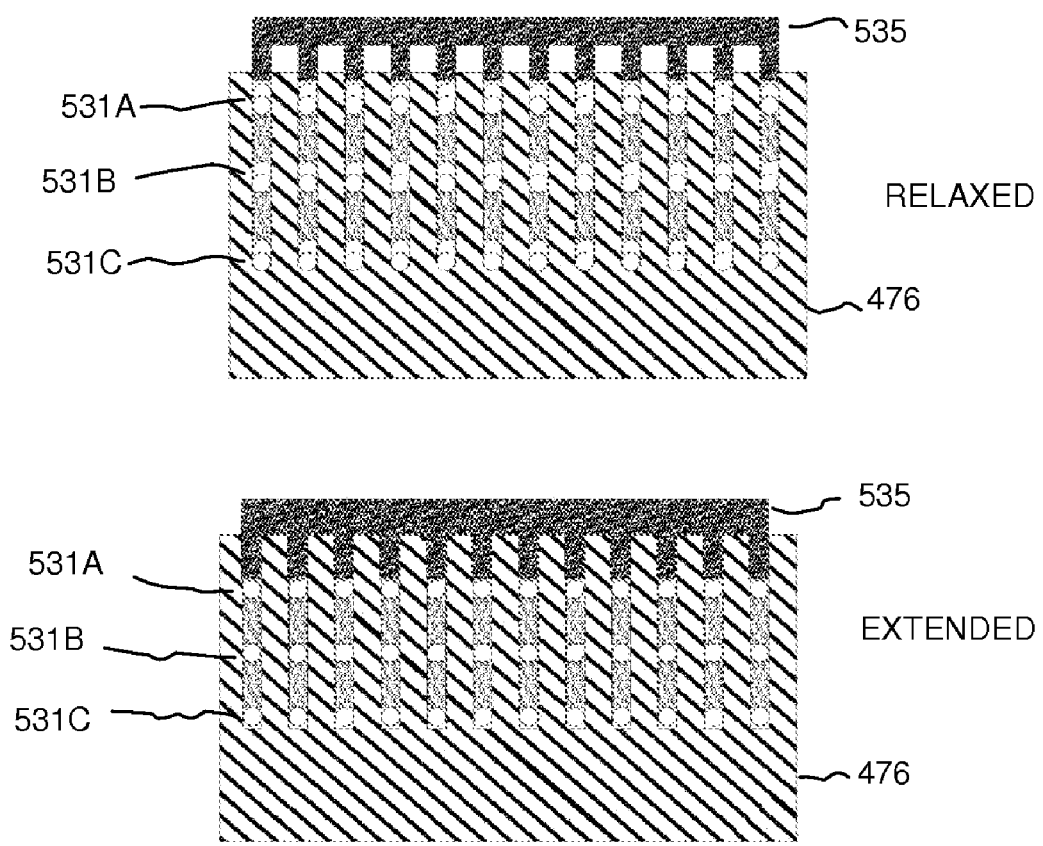
FIG. 54 illustrates a frontal view of an array of buckling beams in both an extended and a relaxed view.

FIG. 54 illustrates a frontal view of an embodiment in which an array of buckling beams in both an extended and a relaxed view.

Although the invention has been described with references to specific exemplary embodiments thereof, it will be evident that various modifications and changes may be made thereto without departing from the broader spirit and scope of the invention. The specification and drawings are, accordingly, to be regarded in an illustrative rather than a restrictive manner.

Original Claims as Clauses of the Detailed Description

Various aspects of the subject-matter described herein are set forth for example and without limitation in the following numbered clauses:

Clause 1. A system comprising:
 a printed circuit board;
 a first electrical structure;
 a second electrical structure; and
 a connector including a first plurality of conductive structures coupled between the first electrical structure and the printed circuit board, and a second plurality of conductive structures coupled between the first electrical structure and the second electrical structure.

Clause 2. The system of clause 1 further comprising a fourth electrical structure, and wherein the connector further includes a third plurality of conductive structures coupled between the first electrical structure and the fourth electrical structure.

Clause 3. The system of clause 1 wherein the first electrical structure comprises a memory module.

Clause 4. The system of clause 1 wherein the first electrical structure comprises at least one memory device.

Clause 5. The system of clause 1 wherein the second electrical structure comprises an integrated circuit device.

Clause 6. The system of clause 5 wherein the integrated circuit device comprises a memory controller.

Clause 7. The system of clause 1 wherein the printed circuit board comprises at least one of a daughter card, a line card, a backplane and a motherboard.

Clause 8. A connector comprising:
 a first plurality of conductive elements to connect to a printed circuit board; and
 a second plurality of signal conductive elements to connect to a signaling structure other than the printed circuit board.

Clause 9. The connector of clause 8 wherein the signaling structure is a multi-conductor cable.

Clause 10. The connector of clause 8 wherein the signaling structure is another connector.

Clause 11. The connector of clause 8 wherein the signaling structure is a memory module.

Clause 12. The connector of clause 8 wherein the connector further comprises a housing adapted to receive a memory module.

Clause 13. The connector of clause 8 further comprising a connector housing, and wherein the first plurality of conductive elements have ends disposed at a first surface of the connector housing, and the second plurality of conductive elements have ends disposed at a second surface of the connector housing.

Clause 14. The connector of clause 13 wherein the first surface and second surface are substantially perpendicular to one another.

Clause 15. A method of transferring signals within a memory system that includes a memory controller and a plurality of memory devices, the method comprising:
 providing power and ground to the memory controller and the plurality of memory devices through a printed circuit board; and
 transferring data between the memory controller and the plurality of memory devices over a signaling path formed separately from the printed circuit board.

Clause 16. The method of clause 15 wherein transferring data between the memory controller and the plurality of memory devices comprises transferring data between the memory controller and the plurality of memory devices over a multi-conductor cable.

Clause 17. The method of clause 15 wherein transferring data between the memory controller and the plurality of memory devices comprises transferring data between the memory controller and the plurality of memory devices over a path formed in connector structures.

Clause 18. A method of transferring signals within a memory system that includes a plurality of memory modules, the method comprising:
 providing power and ground to the plurality of memory modules through a printed circuit board; and
 transferring data between the memory modules over a signaling path formed separately from the printed circuit board.

Clause 19. The method of clause 18 wherein transferring data between the memory modules over a signaling path formed separately from the printed circuit board comprises transferring data between the memory modules over a signaling path formed in connector structures that secure the memory modules to the printed circuit board.

Clause 20. A method of transferring signals within a memory system that includes a plurality of memory modules, the method comprising:
 transferring integrity-tolerant signals to the plurality of memory modules through a printed circuit board; and
 transferring integrity-sensitive signals between the memory modules over a signaling path formed separately from the printed circuit board.

Clause 21. A system comprising:
- a plurality of memory modules;
- a printed circuit board including means for providing power and ground to the plurality of memory modules; and
- means, separate from the printed circuit board, for transferring data between the memory modules.

What is claimed is:

1. An assembly for mechanically securing at least one card to a printed circuit board, the assembly comprising:
   - a first connector body having a first plurality of electrical contacts;
   - a second connector body having a second plurality of electrical contacts, the first connector body being releasably engaged to a first securement member independently from the second connector body, each connector body having opposing first and second sides extending longitudinally, wherein the first plurality of electrical contacts are disposed along the second side of the first connector body, and a second plurality of electrical contacts are disposed along the first side of the second connector body; and
   - a first card with first and second surfaces and a first plurality of surface contacts disposed on the first surface of the first card, the first card being mechanically secured between the second side of the first connector body and the first side of the second connector body, and wherein at least some of the first plurality of contacts are respectively coupled to a corresponding contact from the first plurality of surface contacts, wherein the second connector body further comprises a flexibly rigid conductive member having first and second contact regions, the assembly further comprising a buckling beam configured to forcibly engage the flexibly rigid conductive member with a first force sufficient to induce a deformation of the flexibly rigid conductive member, said deformation advancing the first and second contact regions into electrical engagement with third and fourth contact regions respectively.

2. The assembly of claim 1, wherein the first contact region is selected from among the second plurality of electrical contacts along the first side of the second connector body.

3. The assembly of claim 2 wherein the third contact is selected from among the plurality of edge contacts disposed proximate said edge of the first card.

4. The assembly of claim 3 wherein the second contact region is selected from among the third plurality of contacts along the second side of the second connector body.

5. The assembly of claim 4 wherein the fourth contact is disposed proximate an edge of a second card.

6. The assembly of claim 3 wherein the second contact region is disposed on a bottom surface of the second connector body.

7. The assembly of claim 1, wherein a position of the buckling beam is adjustable between first and second positions, wherein, in the second position, the buckling beam does not exert a force on the flexibly rigid conductive member sufficient to advance the first and second contact regions into electrical engagement with third and fourth contact regions.

8. The assembly of claim 7 further comprising a cam member for adjusting the position of the buckling beam between said first and second positions.

9. The assembly of claim 1, wherein the flexibly rigid conductive member comprises at least one curve.

10. The assembly of claim 9 wherein said at least one curve comprises a bow shaped curve.

11. The assembly of claim 1 wherein the first and second connector bodies are oriented in a parallel orientation to one another.

12. The assembly of claim 1 wherein the first securement member is a slide rail.

13. The assembly of claim 12 wherein said second connector body is slidably engaged to the slide rail.

14. The assembly of claim 13 further comprising a second slide rail, wherein the first and second connector bodies are slidably engaged with the second slide rail.

15. The assembly of claim 1, the first card further comprising a second plurality of surface contacts disposed on the second surface, wherein at least some of the second plurality of surface contacts are respectively coupled to a corresponding contact from the second plurality of contacts.

* * * * *